(12) United States Patent
Salman et al.

(10) Patent No.: US 8,907,718 B2
(45) Date of Patent: Dec. 9, 2014

(54) PASSIVE RESISTIVE-HEATER ADDRESSING NETWORK

(75) Inventors: Saed Salman, Verdun (CA); Oleg Grudin, Montreal (CA); Leslie M. Landsberger, Montreal (CA); Gennadiy Frolov, Montreal (CA); Tommy Tsang, Scarborough (CA); Zhen-grong Huang, Verdun (CA)

(73) Assignee: Sensortechnics GmbH, Puchheim (DE)

( * ) Notice: Subject to any disclaimer, the term of this patent is extended or adjusted under 35 U.S.C. 154(b) by 731 days.

(21) Appl. No.: 13/254,732

(22) PCT Filed: Mar. 4, 2010
(Under 37 CFR 1.47)

(86) PCT No.: PCT/CA2010/000318
§ 371 (c)(1),
(2), (4) Date: Mar. 16, 2012

(87) PCT Pub. No.: WO2010/099622
PCT Pub. Date: Sep. 10, 2010

(65) Prior Publication Data
US 2012/0176180 A1 Jul. 12, 2012

Related U.S. Application Data

(60) Provisional application No. 61/157,317, filed on Mar. 4, 2009.

(51) Int. Cl.
*H01H 37/76* (2006.01)
(52) U.S. Cl.
USPC .......................... 327/525; 365/225.7; 326/41

(58) Field of Classification Search
USPC .......................... 327/525; 365/225.7; 326/41
See application file for complete search history.

(56) References Cited

U.S. PATENT DOCUMENTS

| | | | |
|---|---|---|---|
| 3,803,450 A * | 4/1974 | Trogdon | 345/69 |
| 4,027,196 A * | 5/1977 | Criscimagna et al. | 345/70 |
| 4,198,744 A | 4/1980 | Nicolay | |
| 4,209,894 A | 7/1980 | Keen | |
| 4,412,241 A | 10/1983 | Nelson | |
| 4,413,272 A | 11/1983 | Mochizuki et al. | |
| 4,679,310 A | 7/1987 | Ramachandra et al. | |
| 4,907,117 A | 3/1990 | Pease et al. | |
| 5,361,001 A | 11/1994 | Stolfa | |
| 5,414,245 A * | 5/1995 | Hackleman | 219/548 |
| 5,889,694 A * | 3/1999 | Shepard | 365/105 |
| 5,891,762 A | 4/1999 | Sakai et al. | |

(Continued)

FOREIGN PATENT DOCUMENTS

| | | |
|---|---|---|
| EP | 1041629 | 10/2000 |
| EP | 0986105 | 11/2005 |
| EP | 1895544 | 3/2011 |

OTHER PUBLICATIONS

International Search Report dated Apr. 15, 2010 issued by the International Bureau (WIPO) in connection with the corresponding International patent application No. PCT/CA2010/000318.

*Primary Examiner* — Kenneth B. Wells
(74) *Attorney, Agent, or Firm* — Norton Rose Fulbright Canada LLP

(57) ABSTRACT

There is described a passive heater-and-diode multiplexing network for selective addressing of thermally-coupled and electrically-disconnected fuses within a passive device network (resistor/capacitor/inductor) or within an application circuit.

27 Claims, 13 Drawing Sheets

(56) References Cited

U.S. PATENT DOCUMENTS

| | | |
|---|---|---|
| 6,403,403 B1 * | 6/2002 | Mayer et al. .................. 438/132 |
| 6,437,640 B1 * | 8/2002 | Mayer et al. .................. 327/565 |
| 6,501,107 B1 | 12/2002 | Sinclair et al. |
| 6,587,394 B2 * | 7/2003 | Hogan ..................... 365/230.06 |
| 7,422,972 B2 | 9/2008 | Babcock et al. |
| 7,813,157 B2 * | 10/2010 | Shepard ........................ 365/105 |
| 2002/0044006 A1 | 4/2002 | Jung et al. |
| 2002/0097079 A1 | 7/2002 | Mayer et al. |
| 2003/0202309 A1 | 10/2003 | Miyaba |
| 2006/0044050 A1 | 3/2006 | Kawagoshi |
| 2007/0152733 A1 | 7/2007 | Huang et al. |

* cited by examiner

PASSIVE RESISTIVE-HEATER ADDRESSING NETWORK

CROSS-REFERENCE TO RELATED APPLICATIONS

This application claims priority under 35 USC 119(e) of U.S. Provisional Patent Application bearing Ser. No. 61/157,317 filed on Mar. 4, 2009, the contents of which are hereby incorporated by reference.

TECHNICAL FIELD

The present invention relates to the field of fuses and other types of heaters, and more specifically, to fuses and heaters that can be fabricated on integrated circuits and independently addressed for the purpose of varying the properties of the circuit.

BACKGROUND

It is often desirable that electronic circuits be adjusted or re-configured after manufacture, packaging, or assembly. One technique often used for adjustment or reconfiguration of an electronic circuit is the use of fuses, which are electrical connections which may be disconnected by "blowing" a fuse. Blowing the fuse turns a low-resistance (conductive) electrical connection into an open-circuit.

A common application of fuses is in the adjustment of resistance within an analog circuit. Fuse-adjustable resistances may be implemented by an array of elemental resistors, where a subset of the array remains connected (in series or parallel) to form the resulting resistance after blowing a number of fuses. The particular fuses blown, and arrangement of remaining resistor elements, determine the final (adjusted) resistance.

FIG. 1a shows a common arrangement implementing a fuse-adjustable resistance, having 6 bits of precision. The total resistance in this example is 64 R, while the smallest unit of resistance change is R, which is $2^6$ times smaller than the maximum resistance. FIG. 1b shows a general example of a series-connected fuse-adjustable resistance, having 6 fuses in order to independently (selectively, in a random-access manner) include 6 different resistances R1-R6. FIG. 1c shows a general example of a parallel-connected fuse-adjustable resistance, having 3 fuses to independently (selectively, in a random-access manner) disconnect 3 different resistances R1-R3. Since in each of these circuits the fuse-adjustable resistance is a two-terminal circuit element, a "terminal 1" and a "terminal 2" are shown for each circuit. Note that addressing such fuses typically requires direct access to the fuses themselves (i.e. both ends of each fuse, as illustrated in FIGS. 1a, 1b, 1c).

Since resistances (and also capacitors, inductors) are in principle passive devices, it is desirable to have a fuse-adjustable resistor (or capacitor/inductor) whose fuse-blowing circuitry is passive, not requiring active circuitry, in order to avoid additional process requirements which would be required for the creation of active circuitry.

SUMMARY

There is described herein a passive heater-and-diode array to implement a passive multiplexing network for thermally-coupled (electrically-disconnected) addressing of fuses or other types of heaters within a network of passive circuit elements (resistor(s)/capacitor(s)/inductor(s)), or within a more general application circuit. This heater-and-diode multiplexer array can be used when the physical fuses (the fuse connections within the application circuit) are thermally coupled to the fuse-blowing circuitry, but not electrically coupled to the fuse-blowing circuitry, such that the fuse-blowing circuitry does not interfere with the application circuit. The fuse-and-diode multiplexer includes heaters, which are electrically-isolated from but thermally-coupled to the fuses which are part of the application circuit.

In accordance with a first broad aspect of the present invention, there is provided a resistive-heater addressing network comprising: at least two pairs of heater-diode connections, each pair of heater-diode connections comprising: a first unidirectional heater-diode connection comprising a first resistive-heater and at least one first diode connected together in series, the at least one first diode directed in a first forward-biased direction; a second unidirectional heater-diode connection comprising a second resistive-heater and at least one second diode connected together in series, the at least one second diode directed in a second forward-biased direction opposite from the first forward-biased direction; N nodes, where N is an integer >2, each one of the N nodes being connected to at least another one of the N nodes by one of the pairs of heater-diode connections, each resistive-heater of the network being individually addressable by applying a voltage difference across a pair of nodes.

In accordance with a second broad aspect of the present invention, there is provided a circuit. The circuit comprises a resistive-heater addressing network comprising N nodes, where N is an integer >1, at least one of the N nodes connected to at least another one of the N nodes by a pair of heater-diode connections, each pair of heater-diode connections comprising: a first unidirectional heater-diode connection comprising a first resistive-heater and at least one first diode connected together in series, the at least one first diode directed in a first forward-biased direction; and a second unidirectional heater-diode connection comprising a second resistive-heater and at least one second diode connected together in series, the at least one second diode directed in a second forward-biased direction opposite to the first forward-biased direction. The circuit also comprises an application circuit electrically isolated from the resistive-heater addressing network comprising at least two fuses each thermally-coupled to one of said first and second resistive-heater.

In one embodiment, the circuit comprises N>2 nodes. It should be understood that all embodiments described for the resistive-heater addressing network may be implemented in the present circuit that includes the resistive-heater addressing network and the application circuit.

In one embodiment of the circuit and the resistive-heater addressing network, fuse-blowing power $P_H^*/2$<heater-power level below which the fuse remains unaffected $P_{H\text{-}th\text{-}lower}$. In another embodiment, fuse-blowing power $P_H^*$>a heater-power level above which fuse-blowing is reliable $P_{H\text{-}th\text{-}upper}$>a heater-power level below which the fuse remains unaffected $P_{H\text{-}th\text{-}lower}$>a maximum power level dissipated in any non-addressed heater $P_{H\text{-}non\text{-}addressed\text{-}max}$.

In accordance with a third broad aspect of the present invention, there is provided a method for selectively addressing specific resistive-heaters from a resistive-heater addressing network, the method comprising: selecting a pair of nodes from the resistive-heater addressing network having N nodes, where N is an integer >1, at least one of the N nodes connected to at least another one of the N nodes by a pair of heater-diode connections, each pair of heater-diode connections comprising: a first unidirectional heater-diode connection comprising a first resistive-heater and at least one first diode connected together in series, the at least one first diode directed in a first forward-biased direction; and a second unidirectional heater-diode connection comprising a second resistive-heater and at least one second diode connected together in series, the at least one second diode directed in a second forward-biased direction opposite to the first forward-biased direction; and applying a potential difference across a selected pair of nodes to cause a current to flow in at least one of the first unidirectional heater-diode connection and the second unidirectional heater-diode connection in accordance with a polarity of the potential difference, thereby addressing a corresponding resistive-heater, while leaving N–2 remaining nodes in the network electrically floating.

In one embodiment of the method, applying a potential comprises applying a potential to cause fuse-blowing power $P_H^*$>a heater-power level above which fuse-blowing is reliable $P_{H\text{-}th\text{-}upper}$>a heater-power level below which the fuse remains unaffected $P_{H\text{-}th\text{-}lower}$>a maximum power level dissipated in any non-addressed heater $P_{H\text{-}non\text{-}addressed\text{-}max}$.

In this specification, $P_{H\text{-}th\text{-}upper}$ is intended to refer to the heater-power level above which fuse-blowing is reliable. $P_{H\text{-}th\text{-}lower}$ is intended to refer to the heater-power level below which the fuse remains unaffected. $P_{H\text{-}non\text{-}addressed\text{-}max}$ is intended to refer to the maximum power level dissipated in any non-addressed heater, in any state of the heater-and-diode network, during normal random-access independent addressing of any subset of the heaters. $\Delta V$ is the voltage difference applied between a pair of nodes in the fuse-addressing network. $\Delta V^*$ is the $\Delta V$ which corresponds to an appropriate fuse-blowing power, $P_H^*$, being dissipated in a heater and deemed appropriate to blow a fuse. $V_H^*$ refers to the voltage applied directly to the heater (not including any diode(s)), corresponding to $P_H^*$. $P_H^*$ is intended to refer to the fuse-blowing power, dissipated in the heater itself, deemed to be appropriate to blow the fuse, $P_H^*=[V_H^2/R_H]^*$ where $R_H$ is the heater resistance. $P_H^*$ should be sufficiently above a threshold for fuse-blowing to ensure that the fuse be fully and permanently blown, not partially-blown or non-permanently blown. $P_H^*$ should be at or above $P_{H\text{-}th\text{-}upper}$, for the fuse to be fully and permanently blown.

BRIEF DESCRIPTION OF THE DRAWINGS

Further features and advantages of the present invention will become apparent from the following detailed description, taken in combination with the appended drawings, in which.

It will be noted that throughout the appended drawings, like features are identified by like reference numerals.

DETAILED DESCRIPTION

Figure 2A:
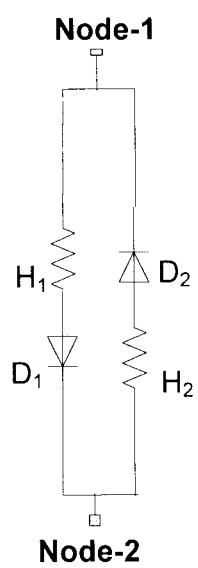
FIG. 2a illustrates a pair of unidirectional heater-and-diode connections, each having a single diode, where the heater-and-diode connections are oriented such that the diodes are oppositely-directed from each other, in accordance with one embodiment.

The heater-and-diode array described herein consists of N nodes, where N is an integer greater than 1. In one embodiment, each node is physically connected to each other node by a pair of unidirectional heater-and-diode connections. A unidirectional heater-and-diode connection consists of a resistor-heater in series with at least one diode, which thus allows current to flow in only one direction within that "heater-and-diode connection". Each diode only allows current to flow in its forward-biased direction. A pair of such unidirectional heater-and-diode connections, having oppositely-directed diodes, consists of two heaters and at least two diodes. An example is shown in FIG. 2a, where N=2.

With N nodes, and with each pair of nodes connected by a pair of oppositely-directed heater-and-diode connections, there would be N*(N−1) unidirectional connections within the system of nodes. See FIGS. 3a, 3b, 3d, for networks consisting of N=3, N=4, and N=5 nodes, respectively. Note that N*(N−1)=2*[(N−1)+(N−2)+ . . . +1].

In some embodiments, only a subset of the N*(N−1) connections are present if the application needs fewer than N*(N−1) fuse-heaters. Entire pairs of connections may be omitted, or selected unidirectional connections may be omitted from the set.

Figure 2B:
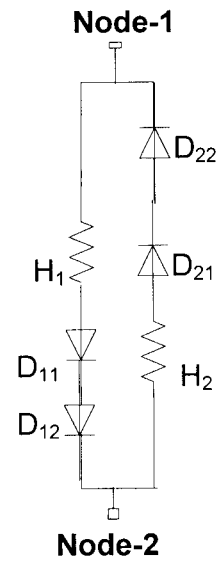
FIG. 2b illustrates a pair of unidirectional heater-and-diode connections, where each of the pair has a set of two diodes, where within each unidirectional connection the two diodes are oriented in the same forward-biased direction, and where the two sets of diodes are oppositely-directed from each other, in accordance with one embodiment.

For reasons described below, it may be useful in some cases for a unidirectional heater-and-diode connection to have more than one diode in each forward-biased direction. FIG. 2b shows a pair of such unidirectional heater-and-diode connections where there are two diodes in each forward-biased direction. A "unidirectional heater-and-diode connection" should be understood as a single heater-resistor in series with a set of one or more diodes, where each diode within this set of diodes allows current in the same forward-biased direction (where all the diodes within this set are pointed forward-biased in the same direction). In FIG. 2b, diodes $D_{11}$ and $D_{12}$ form such a set of diodes both allowing current in the same forward-biased direction. Diodes $D_{21}$ and $D_{22}$ form another set of diodes, both allowing current in the same forward-biased direction, which is the direction opposite from $D_{11}$ and $D_{12}$.

In one embodiment there is provided a heater-and-diode array consisting of N nodes, with each node connected to each other node by a heater-and-diode connection, where all the heaters have the same resistance, and where the resistance is designed to deliver fuse-blowing power $P_H^*$ to the fuse.

In another embodiment, there is provided a heater-and-diode array, where the heaters are designed to deliver fuse-blowing power $P_H^*$ to a particular (addressed) fuse, designed such that $P_H^*$ is sufficiently above $P_{H\text{-}th\text{-}upper}$, and such that the power being delivered to any other non-addressed heater is sufficiently below $P_{H\text{-}th\text{-}lower}$.

The resistive-heater addressing network causes heat to be dissipated at a specific localized zone (position, area or volume) within an electric circuit. In one embodiment, the heater and its targeted heat-dissipation zone may be thermally-isolated from the surroundings in order to cause a difference between the heat-targeted zone and non-heat-targeted zones on the same chip or within the same electric circuit. This may also avoid having functional elements near the zone of the fuse potentially damaged by the high temperature. Thermal isolation is typically measured in units of degrees of temperature rise of that zone per amount of power dissipated within that zone. Various techniques for obtaining different levels of thermal isolation are known in the field of MEMS and in the field of thermally-isolated microstructures. Examples can be found in U.S. Pat. No. 7,119,656, U.S. Pat. No. 7,465,977, U.S. Pat. No. 7,261,461, U.S. Pat. No. 7,422,972 and US Publication No. 2008/0179713.

In one embodiment, there is provided a heater-and-diode array, where the heater does not change (or insignificantly changes) its heating power due to a previous addressing event. In other words, the heater's resistance after an addressing event is the same as it was before the addressing event, in order to preserve the ability to do other addressing events afterwards. This happens by using a combination of materials and microstructure geometry which does not thermally trim too much when the required fuse-blowing power $P_H^*$ is applied within it. The fuse material has a particular temperature at which it melts and/or vaporizes, leading to fuse-blowing. The geometry of the fuse within the thermally-isolated microstructure should allow the fuse to become open-circuited when it reaches that temperature for the required amount of time, while the heater stays intact and its resistance doesn't change significantly. The fuse resistance itself should be small enough to be insignificant in the application circuit. The microstructure thermal isolation should then be high enough (in degrees of temperature-rise at the hottest zone per mW dissipated within it) for the hottest zone of the microstructure (and therefore the portion of the fuse-conductor which is positioned at that hottest zone) to reach high enough temperatures, without dissipating amounts of power within that heater that could cause significant thermal trimming on the heater itself—i.e. such that the heater's overall resistance (as seen by the rest of the network) changes too much that the circuit no longer offers independent addressing.

Note that the heater and microstructure (materials and geometry) can be designed such that the heater is able to handle the electric current driven through it while still attaining the temperature required for blowing the fuse. For example, the heater body in the hot zone can be designed to have enough cross-sectional area to carry an appropriate amount of current without changing its properties due to electro-migration, and the microstructure can be designed to provide enough thermal isolation such that it reaches the fuse-blowing temperature due to power dissipation from that appropriate amount of current. The fuse-material and fuse layout in the hot zone intended for blowing can be chosen such that the fuse-blowing temperature does not significantly thermally trim the heater material.

In yet another embodiment, there is provided a heater-and-diode array, where an addressing event on a particular heater causes that particular heater to become open-circuited.

Thermally isolated microstructures with high thermal isolation (e.g. several K/mW to several tens of K/mW) may be used in some embodiments. Examples of thermally-isolated microstructures can be found in U.S. Pat. No. 7,249,409, the contents of which are hereby incorporated by reference. When using thermally-isolated microstructures, the power needed to raise the temperature high enough to blow the fuse is not as high as for fuses with lower thermal isolation. Since the needed power is not as high, the current-carrying capacity of the fuse-blowing heater does not need to be as high in order to maintain integrity of the heater during the fuse-blowing operation. Indeed, this feature is particularly useful in the case of fuses in fine-line-width (deep-submicron) IC fabrication technologies, since the current-carrying capability of the metal lines is reduced (because the metal layers tend to be thinner than for larger-line-width technologies). The high thermal isolation means the rest of the integrated circuit chip is not affected while the power is being applied to the fuse-heater, thus the possibility of raising the overall temperature of the chip is not a concern, and thus the fuse-blowing power need not be turned off early for that reason. By maintaining the heater unchanged or undamaged at the fuse-blowing power-level, and if there are no other reasons necessitating turning off the fuse-blowing power, then the fuse-blowing power can be maintained after the fuse first becomes open-circuited, at least long enough to ensure permanent fusing.

Figure 4A:
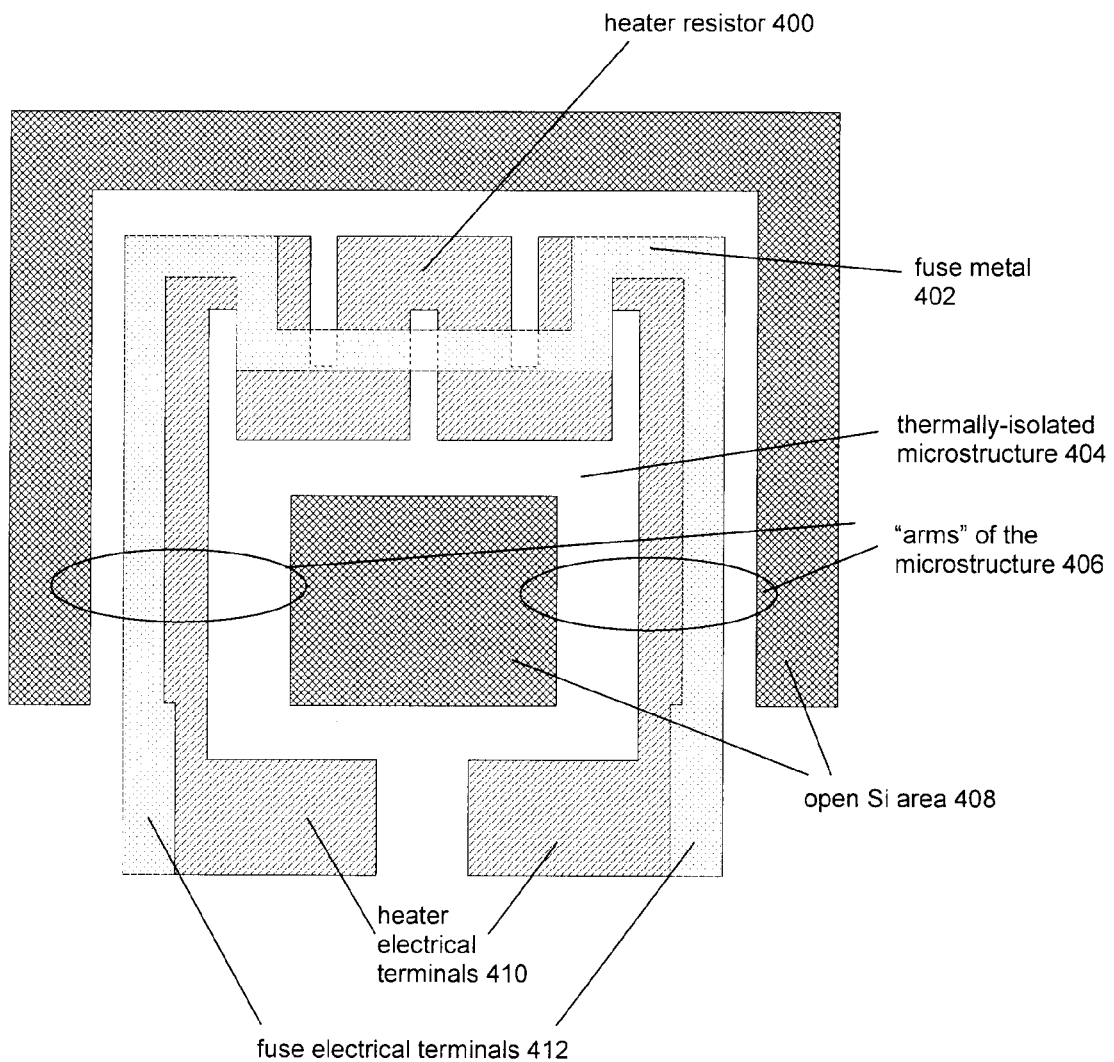
FIG. 4a is a top view of a layout of a cantilever-shaped thermally-isolated thermally-coupled fuse microstructure, in accordance with one embodiment.
Figure 4B:
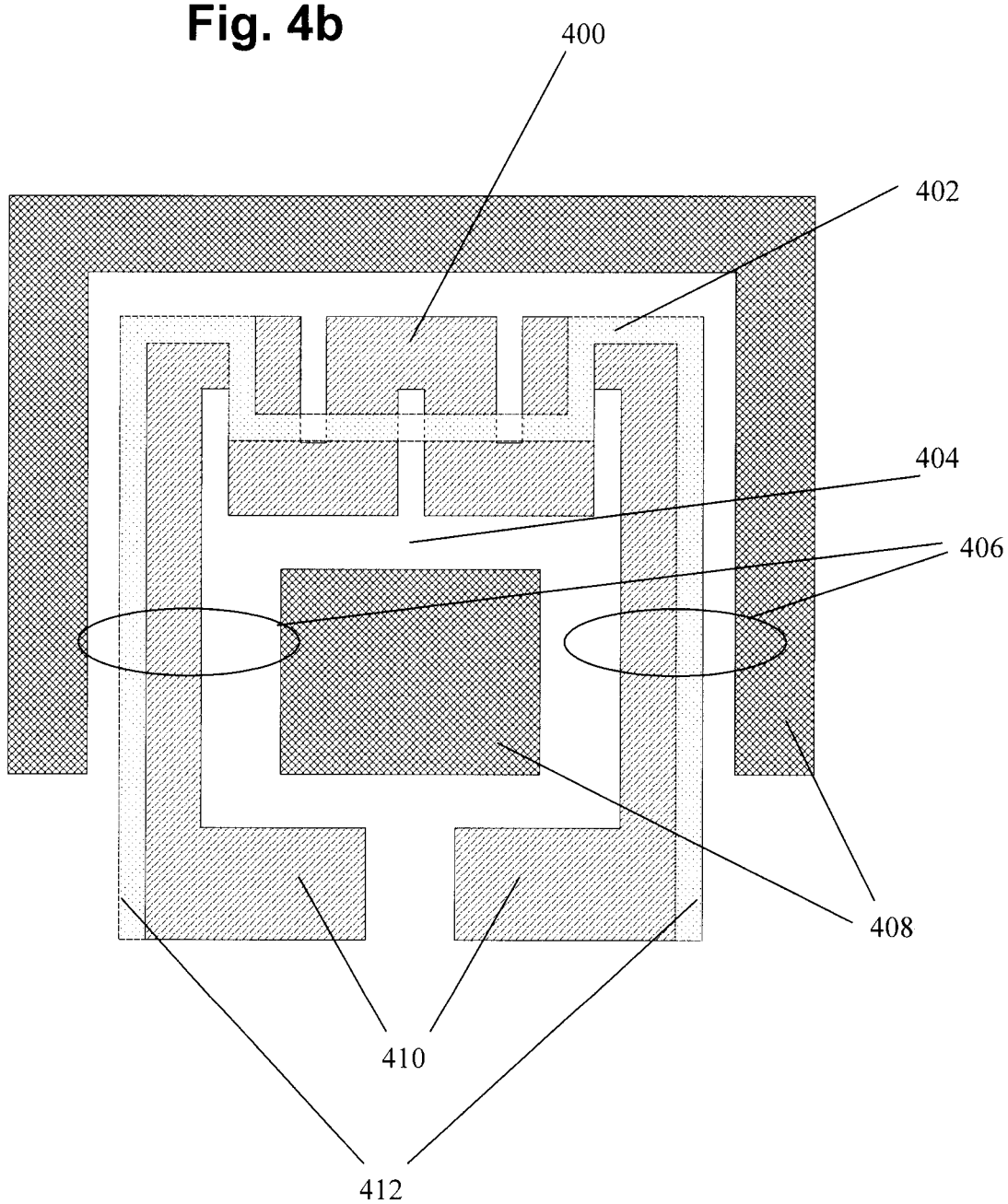
FIG. 4b is a top view layout of a cantilever-shaped thermally-isolated thermally-coupled fuse microstructure, having narrower fuse-metal trace, and therefore higher thermal isolation than the structure shown in FIG. 4a, in accordance with an embodiment.

The microstructures shown schematically in FIGS. 4a-4d are examples of thermally-isolated microstructures suitable for inclusion in the addressing network described herein. FIG. 4a is a top view of a layout of a cantilever-shaped thermally-isolated, thermally-coupled fuse-and-heater microstructure. FIG. 4b is a top view layout of a cantilever-shaped thermally-isolated, thermally-coupled fuse-andheater microstructure having narrower fuse-metal traces, and therefore higher thermal isolation than the structure shown in FIG. 4a. However in this case of FIG. 4b, the fuse resistance will be higher than it was in FIG. 4a, and one should be mindful that the fuse resistance itself should remain small enough to be insignificant in the application circuit.

Figure 4C:
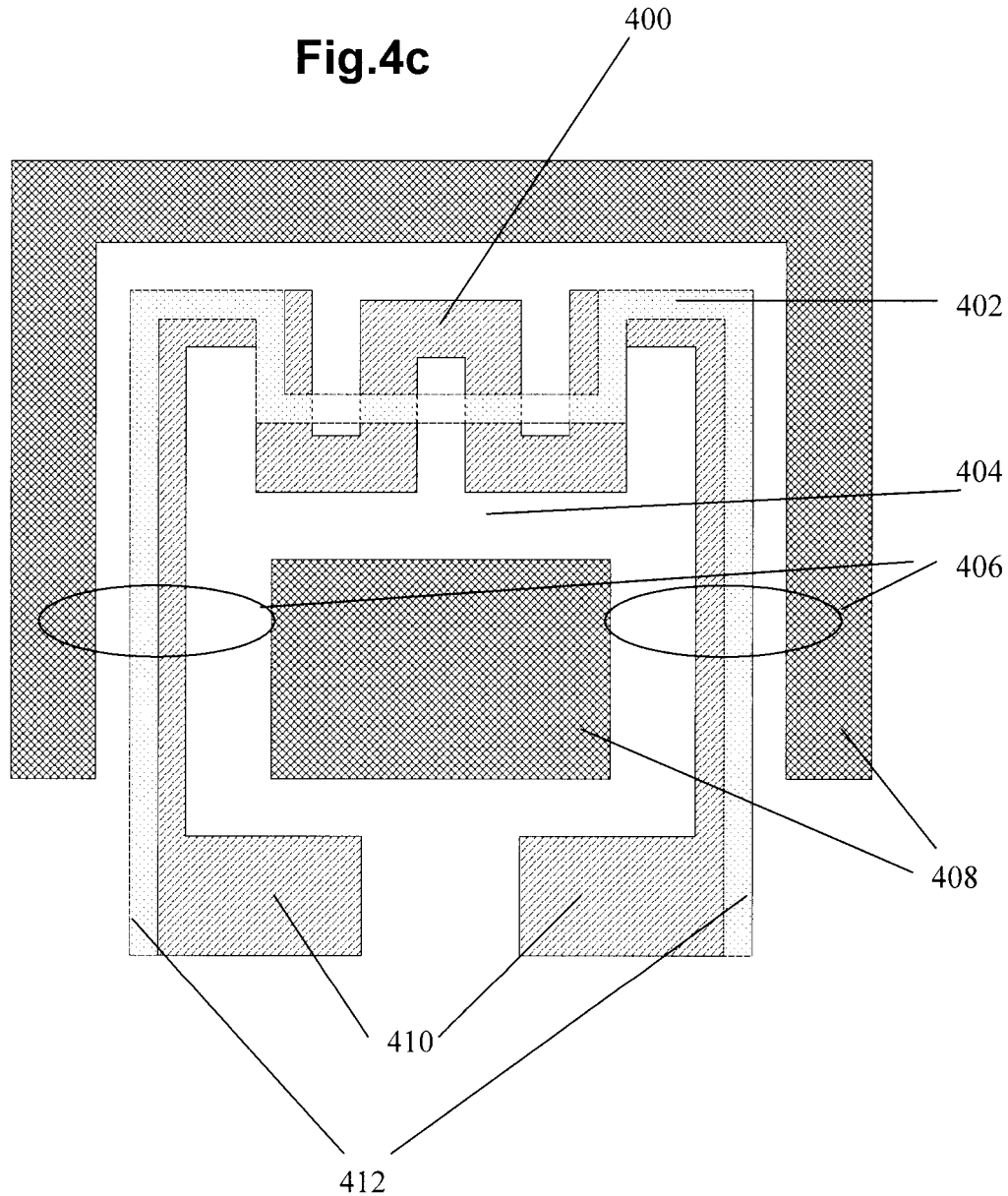
FIG. 4c is a top view layout of a cantilever-shaped thermally-isolated thermally-coupled fuse microstructure, having narrower heater-trace than shown in FIG. 4b, and therefore higher thermal isolation than the structure shown in FIG. 4b, in accordance with an embodiment.
Figure 4D:
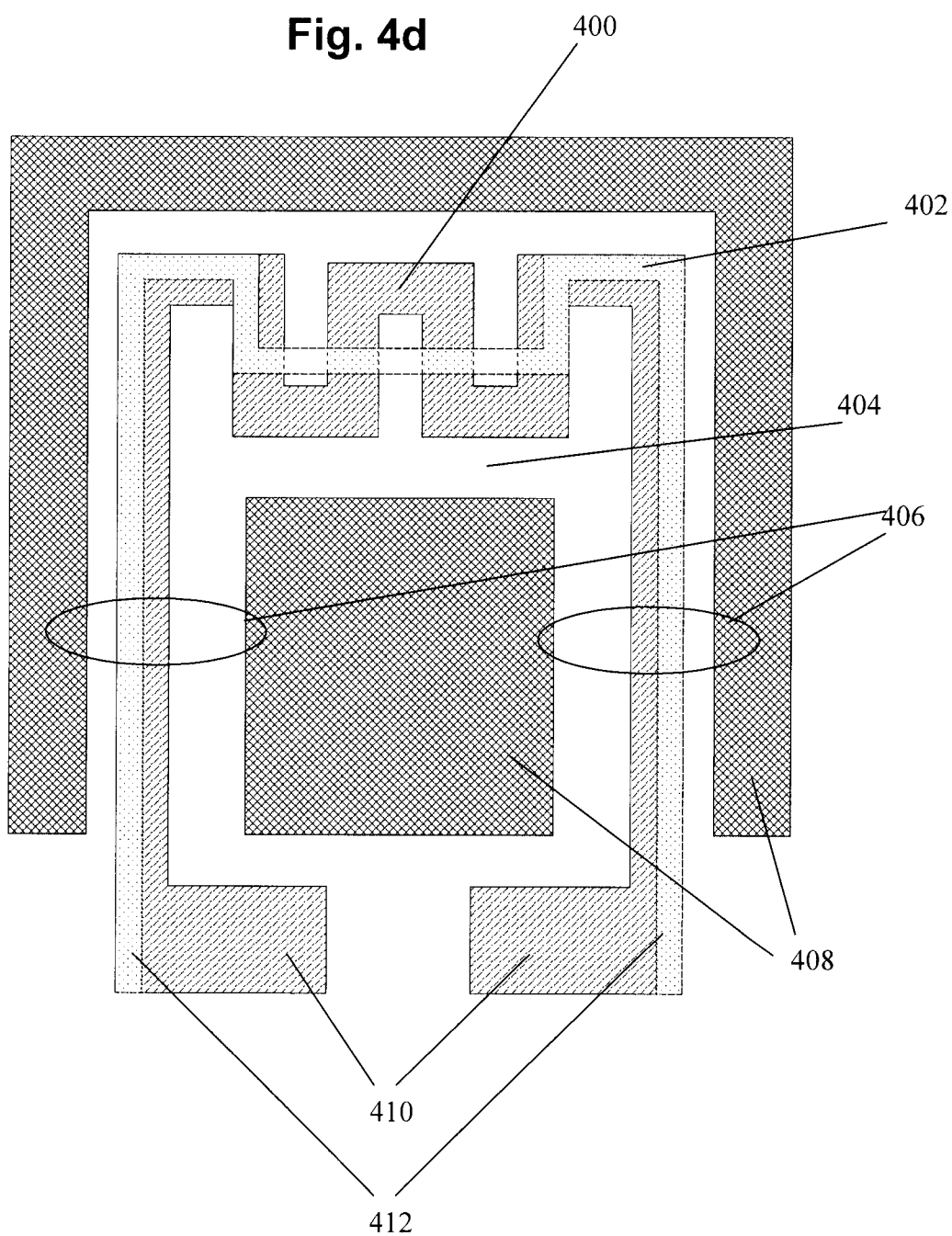
FIG. 4d is a top view layout of a cantilever-shaped thermally-isolated thermally-coupled fuse microstructure, having longer support arms and therefore higher thermal isolation than the structure shown in FIG. 4c, in accordance with an embodiment.

FIG. 4c is a top view layout of a cantilever-shaped thermally-isolated, thermally-coupled fuse-and-heater microstructure, having narrower heater-traces and therefore higher thermal isolation than the structure shown in FIG. 4b. FIG. 4d is a top view layout of a cantilever-shaped thermally-isolated, thermally-coupled fuse-and-heater microstructure having longer support "arms" and therefore higher thermal isolation than the structure shown in FIG. 4c. Many other combinations of microstructure dimensions, heater-trace width, fuse-metal width and microstructure arms are possible, including varying the width of the heater-trace and fuse-metal.

In order to decrease $P_{H\text{-}non\text{-}addressed\text{-}max}$ relative to $P_H^*$, more than one diode may be placed in series with each heater. If one diode is used in series with each heater, then the voltage drop due to a diode is 0.6V, and the voltage across the addressed heater is 0.6V less than the applied voltage. If the heater resistances are unaffected by a previous addressing event, then the voltage across a non-addressed heater will be less than half of the voltage across the addressed heater, due to the presence of the diodes. If a previously-addressed heater is open-circuited due to the previous addressing event, then the presence of the diodes will again favorably affect the voltage and power applied to a non-addressed heater in a subsequent addressing event.

In one embodiment, there is a set of N fuse-blowing-pins, where N is an integer greater than 1, to enable a heater-and-diode array providing N*(N−1) heaters. Each heater is dedicated to blowing a specific fuse within an analog application circuit. Each heater is individually addressable (random access), by applying the proper combination of voltages (electrical potentials) to the set of N fuse-blowing pins. In this context, "addressable" means that the specific heater being "addressed" receives the full fuse-blowing power, while the remainder of the "non-addressed" heaters receive a power level low enough that their associated "non-addressed" fuses are not significantly affected, and low enough that those "non-addressed" heaters are not permanently significantly affected.

One embodiment of a basic heater-and-diode pair unit is shown in FIG. 2a. Another version of a basic heater-and-diode pair unit is shown in FIG. 2b, with two diodes per heater. In general, a heater-and-diode connection may have more than one diode per heater. If "M" is the number of diodes in each heater-and-diode connection, then in general, M can be 1 (as shown in FIG. 2a), or M=2 (as shown in FIG. 2b), or M>2 (not shown).

Each such heater-and-diode pair unit contains two heaters, each individually addressable by applying a certain polarity of voltage. In FIG. 2a, Heater-1 is addressable by applying a higher potential at Node-1 than Node-2, such that diode $D_1$ is forward biased. While Heater-1 is being addressed in this manner, no current (or insignificant current) flows in Heater-2 because its diode $D_2$ is reverse-biased. Similarly, Heater-2 is addressable by applying a higher potential at Node-2 than Node-1, forward-biasing $D_2$ while Heater-1 is protected by reverse-biased $D_1$. A basic heater-and-diode pair thus provides two individually-addressable heaters, controllable by the applied polarity of the potentials at its two nodes.

Figure 2C:
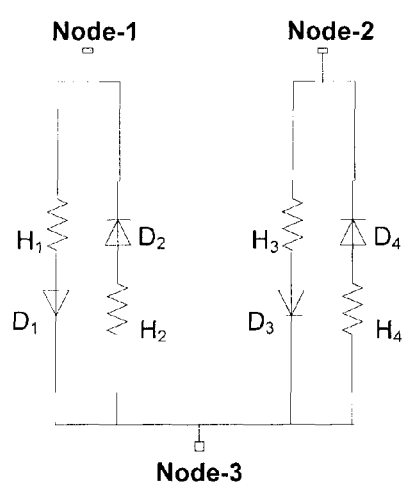
FIG. 2c illustrates two pairs of unidirectional heater-and-diode connections connected together at a common node (Node-3), in accordance with one embodiment.

These basic units can be further configured in arrays having more than 2 nodes. FIG. 2c shows two heater-and-diode pair units configured to have a common node, for a total of 3 nodes. Each heater is individually addressable by applying a certain polarity of voltage between the common node (Node-3) and the appropriate other node, while leaving the remaining node floating or at a voltage substantially equal to the voltage on the common node (Node-3). For example, to address heater $H_1$, Node-1 should receive a higher voltage than Node-3, while Node-2 should be "floating", i.e. not subjected to any externally-applied voltage, or at substantially the same voltage as Node-3. To address heater $H_3$, Node-2 should receive a higher voltage than Node-3, while Node-1 should be floating or at substantially the same voltage as Node-3. To address heater $H_4$, Node-3 should receive a higher voltage than Node-2, while Node-1 should be floating or at substantially the same voltage as Node-3.

Figure 2D:
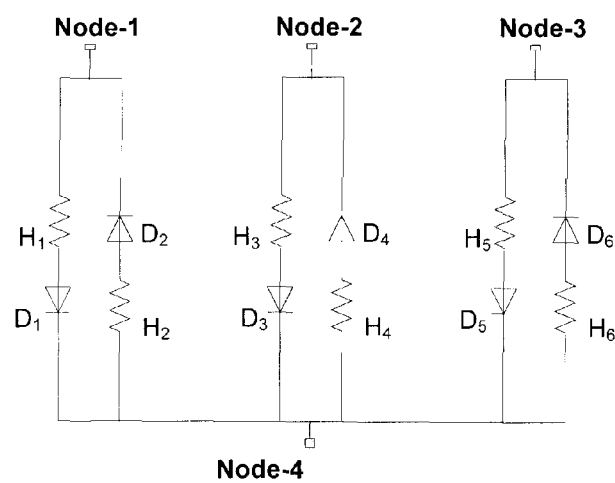
FIG. 2d illustrates three pairs of unidirectional heater-and-diode connections connected together at a common node (Node-4), in accordance with one embodiment.

FIG. 2d shows three such heater-and-diode pair units configured to have a common node, for a total of 4 nodes. Again, in FIG. 2d, each heater is individually addressable by applying a certain polarity of voltage between the common node (Node-4) and the appropriate other node, while leaving the remaining other nodes floating or at a voltage substantially equal to the voltage on the common node (Node-4). For example, to address Heater $H_6$, Node-4 should receive a higher voltage than Node-3, while Node-1 and Node-2 should be floating or at substantially the same voltage as Node-4.

For the types of addressing networks shown in FIGS. 2c (for 3 nodes) and 2d (for 4 nodes), the number of nodes, N can also be greater than 4. These are networks consisting of N nodes (N>2), including one common node. Up to 2*N heaters can be individually addressed in a random-access mode. In this type of addressing network, only one heater is receiving power during a given addressing event, while the remaining heaters receive no significant power (either because they are protected by reverse-biased diodes, or because their heater-and-diode connection receives no voltage-difference.

For the types of addressing networks shown in FIGS. 2c and 2d, each heater can be dedicated to blowing a specific fuse within an analog application circuit. In this case, the heaters are fuse-heaters, and only one fuse-heater is receiving power during a given addressing event, while the remaining fuse-heaters receive no significant power (either because they are protected by reverse-biased diodes, or because their heater-and-diode connection receives no voltage-difference).

Figure 3A:
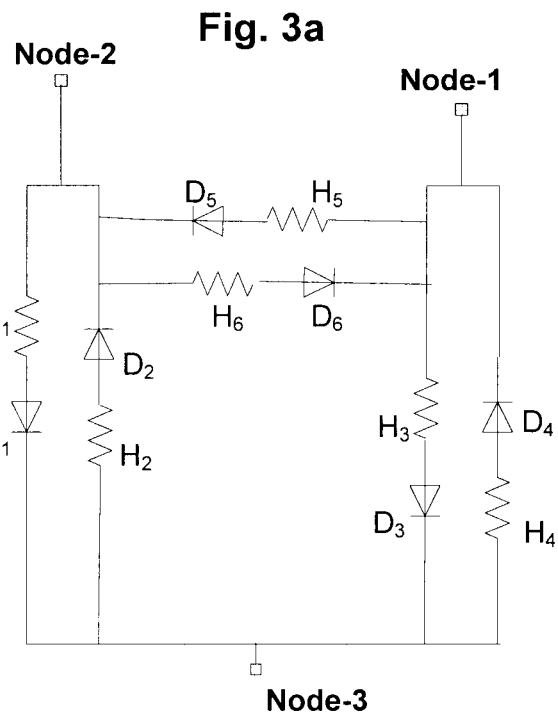
FIG. 3a illustrates a 3-node (N=3) array, including 3*(3−1)=6 unidirectional heater-and-diode connections, in accordance with one embodiment.
Figure 3B:
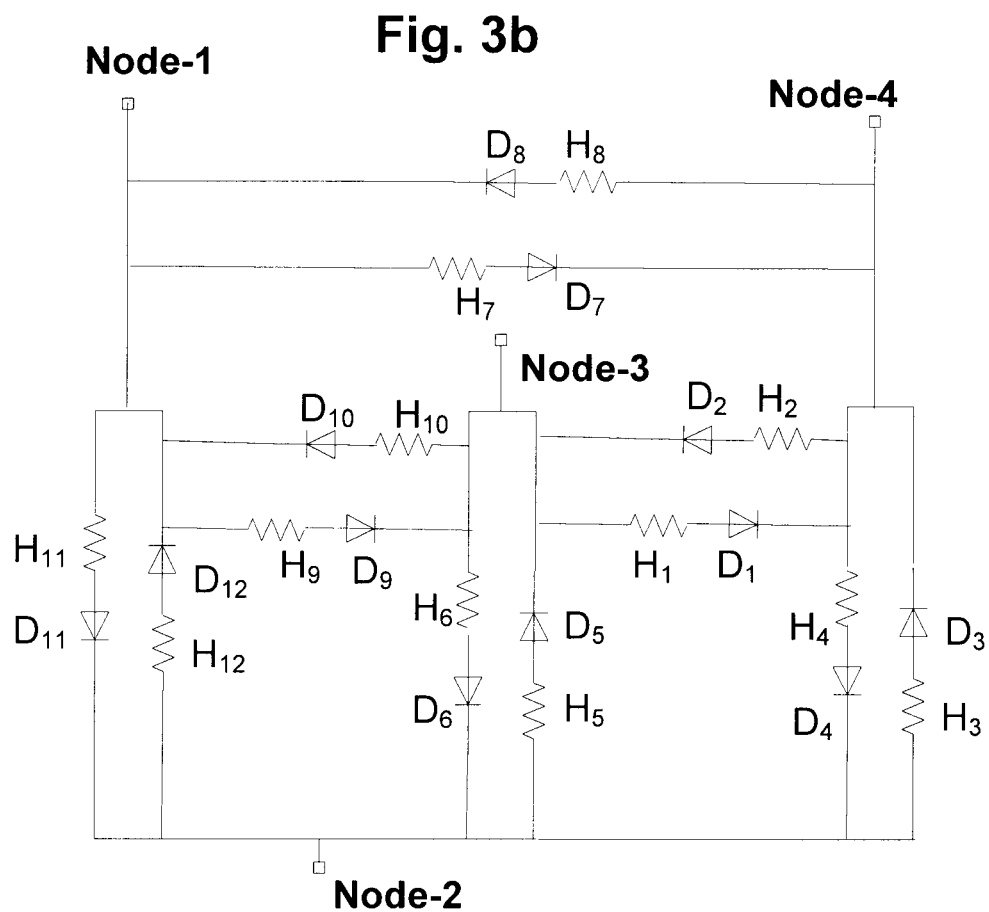
FIG. 3b illustrates a 4-node (N=4) array, including 4*(4−1)=12 unidirectional heater-and-diode connections, in accordance with one embodiment.
Figure 5A:
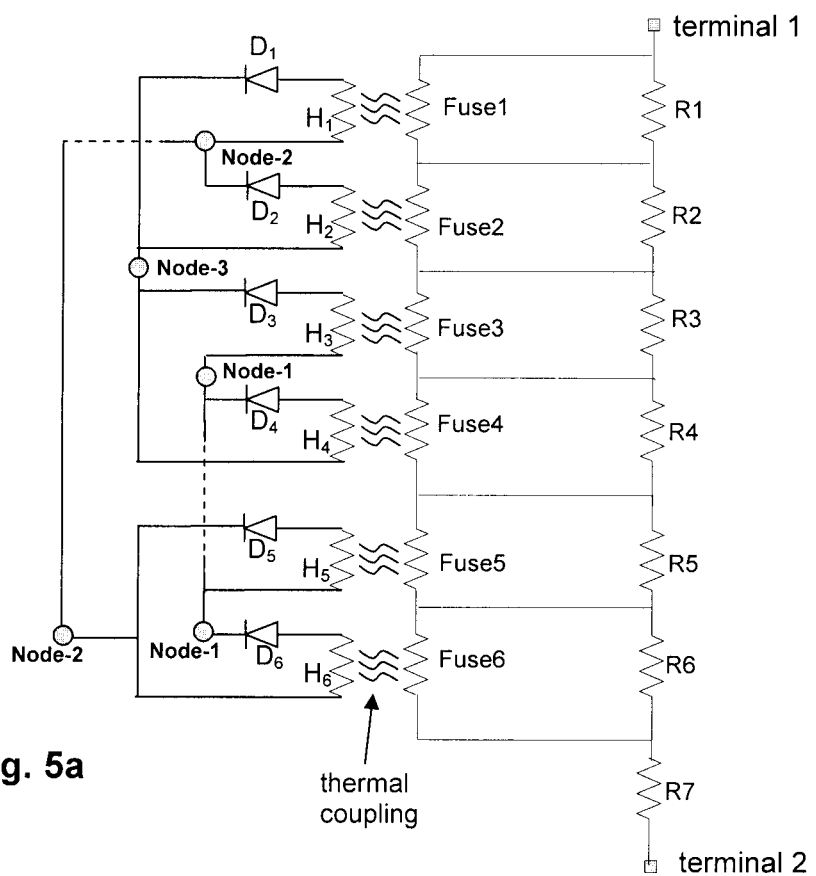
FIG. 5a illustrates an example of a fuse-adjustable application circuit, consisting of seven resistance elements R1 to R7, together with a resistive-heater addressing network for 6 fuses (N=3)
Figure 5B:
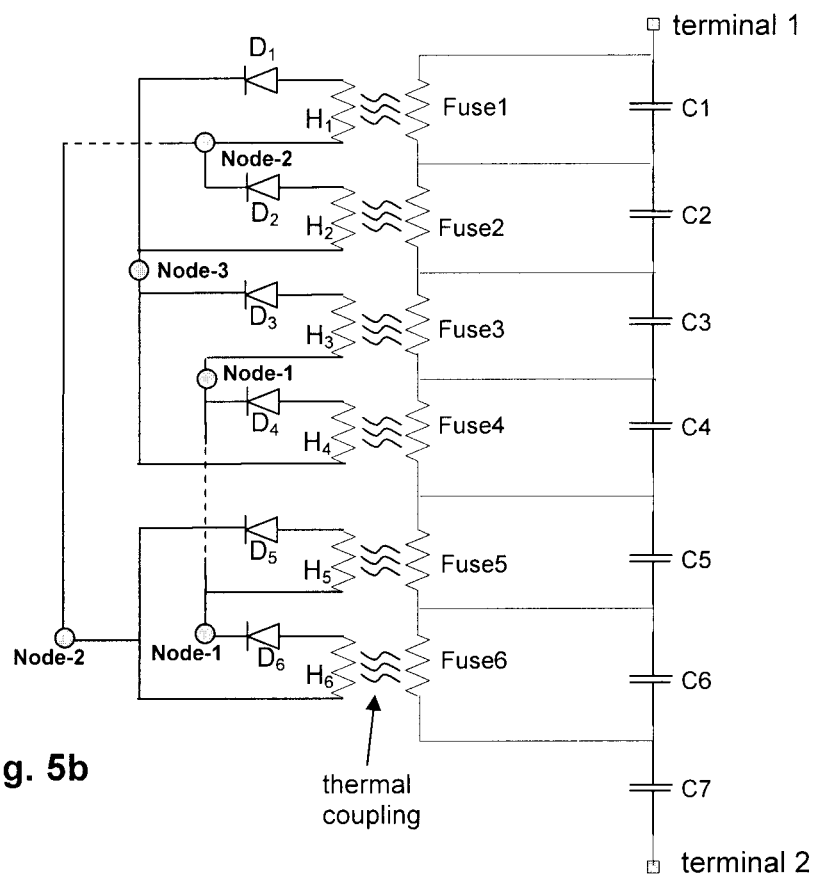
FIG. 5b illustrates an example of a fuse-adjustable application circuit, consisting of seven capacitance elements, C1 to C7, together with a resistive-heater addressing network for 6 fuses (N=3)
Figure 5C:
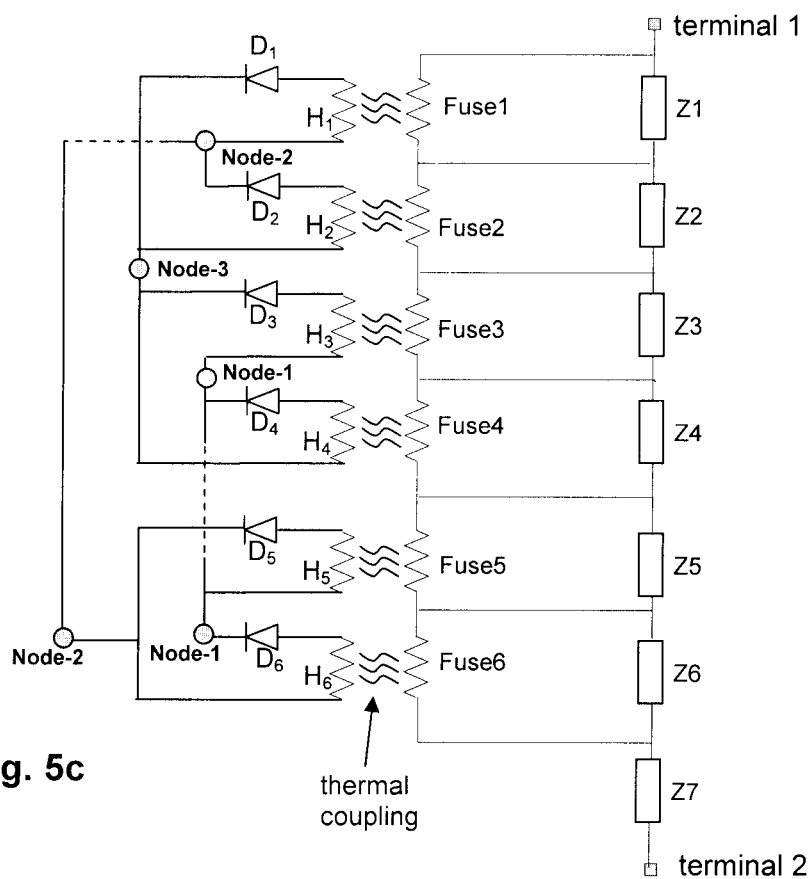
FIG. 5c illustrates an example of a fuse-adjustable application circuit, consisting of seven impedance elements, (generic impedance elements, not necessarily the same type of impedance), Z1 to Z7, together with a resistive-heater addressing network for 6 fuses (N=3).

The basic heater-and-diode units can be configured in another type of array having more than 2 nodes, and offering more addressing for a given number of nodes. Each such heater-and-diode pair unit provides a resistive electrical connection between its two terminals. FIG. 3a shows three such heater-and-diode pair units arranged in a 3-node array (N=3), providing 3*(3−1)=6 Heaters. FIG. 3b shows six such heater-and-diode pair units arranged in a 4-node array (N=4), providing 4*(4−1)=12 Heaters. In general, a heater-and-diode array consisting of N nodes provides up to N*(N−1) Heaters. FIG. 5a illustrates how the 3-node (N=3) resistive-heater addressing circuit from FIG. 3a would be used to address 6 fuses in an application circuit like the series-connected fuse-adjustable resistance shown in FIG. 1b. The addressing circuit is a redrawn version of FIG. 3a, and is only thermally coupled to the application circuit (electrically-isolated, not electrically coupled). Each dashed line in FIGS. 5a,b,c indicate an electrical conducting path which passes "under" or "over" another electrical conducting path (indicated by a solid line) without making a connection between the two paths. The addressing circuit (Heaters $H_1$ to $H_6$, and Diodes $D_1$ to $D_6$) is electrically-isolated from the application circuit (Fuse 1 to Fuse 6, and resistances R1 to R7). FIG. 5b illustrates how the 3-node resistive-heater addressing circuit from FIG. 3a would be used to address 6 fuses in an application circuit consisting of capacitance elements. FIG. 5c illustrates how the 3-node resistive-heater addressing circuit from FIG. 3a would be used to address 6 fuses in an application circuit consisting of impedance elements, (generic electrical impedance elements, not necessarily the same type of impedance), Z1 to Z7.

Another example of an application for the resistive-heater addressing network is in the adjustment, change or reconfiguration of interconnect lines in an integrated circuit, without needing direct electrical connection to those interconnect lines. By using thermal coupling as described herein, specific points within an application circuit can be targeted for disconnection, without applying any current or voltage (without dissipating any electric power) within the application circuit itself.

For example, sometimes in an integrated circuit, the interconnections between integrated circuit components have significant electrical impedances (significant with respect to the function of the circuit). For example, the temperature coefficient of the metal lines may be significant enough to unbalance otherwise-carefully-matched temperature coefficients. For example in high-speed circuits, the interconnect may contribute stray capacitance or inductance to the circuit, again causing non-ideal behavior. It may be desirable to adjust the interconnect properties after manufacturing, or even after packaging of the integrated circuit. For example, this may allow fine-adjusting of the RC time-constants in high-speed digital or analog circuits.

The resistive-heater addressing network may be used to select any typical circuit elements within an integrated circuit. For example, one can adjust capacitance or any other passive component. These techniques allow creation of matched capacitor pairs or matched resistor pairs. These techniques are useful for trimming buried metal in an integrated circuit, which is not accessible to laser trimming. It is also useful in trimming integrated circuits after packaging.

Fuse-adjustment of very low resistances within an integrated circuit presents another application for the resistive-heater addressing network, particularly when the item being adjusted is not the lowest resistance in the circuit. When blowing fuses in an integrated circuit one may use a circuit output for feedback, in order to determine when the fuse has actually been blown. One would expect to see a change in the circuit output when the fuse has been blown. However when the goal of fuse-blowing is adjustment of very low resistances within a circuit, the effect on the circuit may effectively be invisible without more-complicated, more time-consuming measurements (for example, when trying to trim out the effect of metal TCR on mismatches within a circuit). In such cases where the effect of fuse-blowing is not easily visible/measurable, thermally-coupled fuses with high thermal isolation may be used, in order to be able to apply the fuse-blowing power for a pre-determined time, without overly heating the surroundings, and without relying on feedback from a circuit output.

In the types of addressing networks such as shown in FIGS. 3a and 3b, each heater is individually addressable (in a random-access manner) by proper selection of the voltages on the nodes of the array. When N=2, the selection of voltages is simple—both nodes must be connected to fixed electrical potentials, and one of the two nodes must have a higher potential than the other. When N>2, individual addressing requires that at least one node be electrically floating.

Table 1 lists the potentials for addressing each of the six heaters shown in FIG. 3a, in accordance with one embodiment. Table 2a lists the potentials for addressing each of the twelve heaters shown in FIG. 3b, in accordance with one embodiment. Note that in each case (to address each distinct heater), there is one "High" Node, one "Low" Node, and the remainder of the Nodes are Floating.

TABLE 1

Heater-Addressing Voltages for N = 3. See FIG. 3a.

|  | Node-1 (V1) | Node-2 (V2) | Node-3 (V3) |
| --- | --- | --- | --- |
| Heater-1 | Floating | High | Low |
| Heater-2 | Floating | Low | High |
| Heater-3 | High | Floating | Low |
| Heater-4 | Low | Floating | High |
| Heater-5 | High | Low | Floating |
| Heater-6 | Low | High | Floating |

TABLE 2a

Heater-Addressing Voltages for N = 4. See FIG. 3b.

|  | Node-1 ($V_1$) | Node-2 ($V_2$) | Node-3 ($V_3$) | Node-4 ($V_4$) |
| --- | --- | --- | --- | --- |
| Heater-1 | Floating | Floating | High | Low |
| Heater-2 | Floating | Floating | Low | High |
| Heater-3 | Floating | High | Floating | Low |
| Heater-4 | Floating | Low | Floating | High |
| Heater-5 | Floating | High | Low | Floating |
| Heater-6 | Floating | Low | High | Floating |
| Heater-7 | High | Floating | Floating | Low |
| Heater-8 | Low | Floating | Floating | High |
| Heater-9 | High | Floating | Low | Floating |
| Heater-10 | Low | Floating | High | Floating |
| Heater-11 | High | Low | Floating | Floating |
| Heater-12 | Low | High | Floating | Floating |

In one embodiment, a general addressing network, in its initial state (before any fuse-addressing or fuse-blowing), is symmetric, in that it is electrically equivalent from any of the N nodes, or from any pair of nodes within the set of N nodes. It is possible to make alternate networks, where not all available unidirectional heater-and-diode-connections are present, where consequently the network may then not be electrically equivalent from all of the N nodes. Also, if a fuse-heater changes its properties due to a fuse-addressing event, then the network may change its properties as compared to its initial state, and consequently may not be electrically equivalent from all of the N nodes.

In a fuse-addressing network having N nodes, if or when one particular heater is addressed, where one node is "high", one node is "low" and the remaining nodes are "floating", then any current path other than the addressed heater travels through at least two (or more) heater-and-diode connections.

For example, in FIG. 3b, Table 2a (N=4), when Heater-1 is addressed, the current-path between Node-3 and Node-4 has length "1", since the current passes through only one heater-and-diode connection. However, any other current-path from Node-3 (high) to Node-4 (low) has length "2" or "3".

the direct path from Node-3 to Node-4 has length "1", the path from Node-3 to Node-1 to Node-4 has length "2", the path from Node-3 to Node-2 to Node-4 has length "2", the path from Node-3 to Node-1 to Node-2 to Node-4 has length "3", the path from Node-3 to Node-2 to Node-1 to Node-4 has length "3".

Figure 3C:
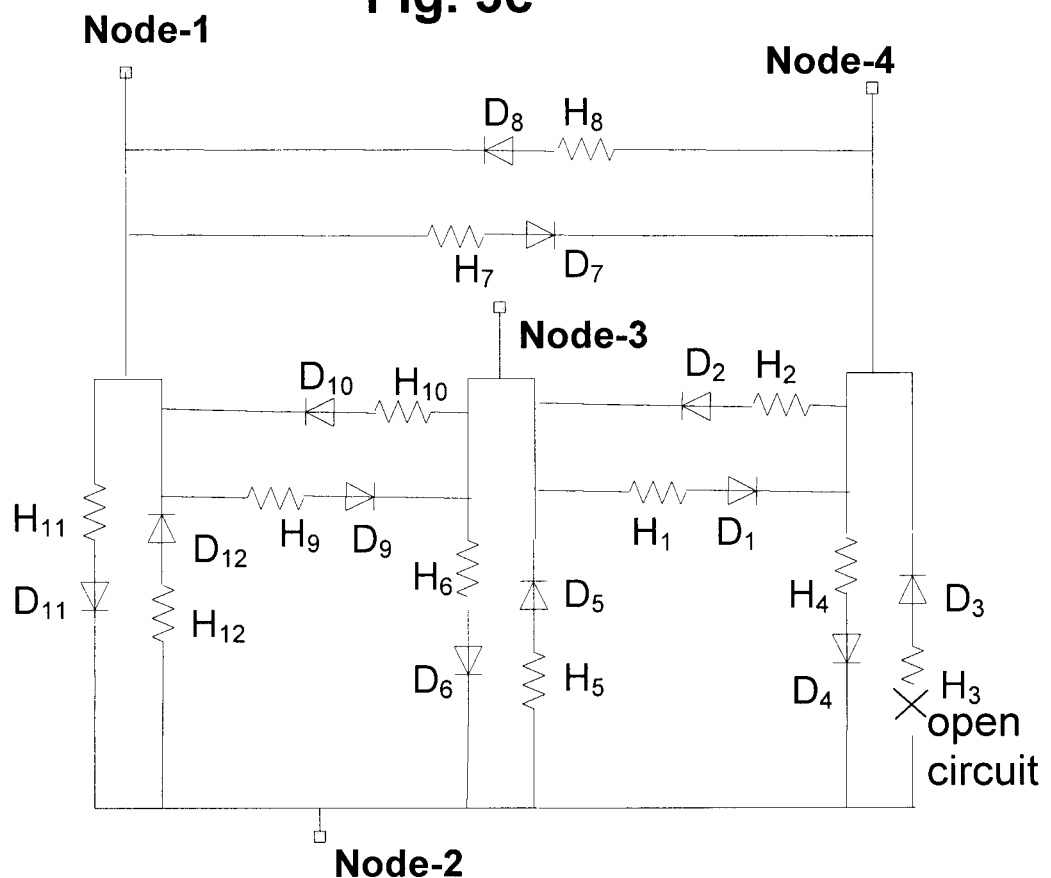
FIG. 3c illustrates a 4-node (N=4) array, including 4*(4−1)=12 unidirectional heater-and-diode connections, with $H_3$ open-circuited, in accordance with one embodiment.
Figure 3D:
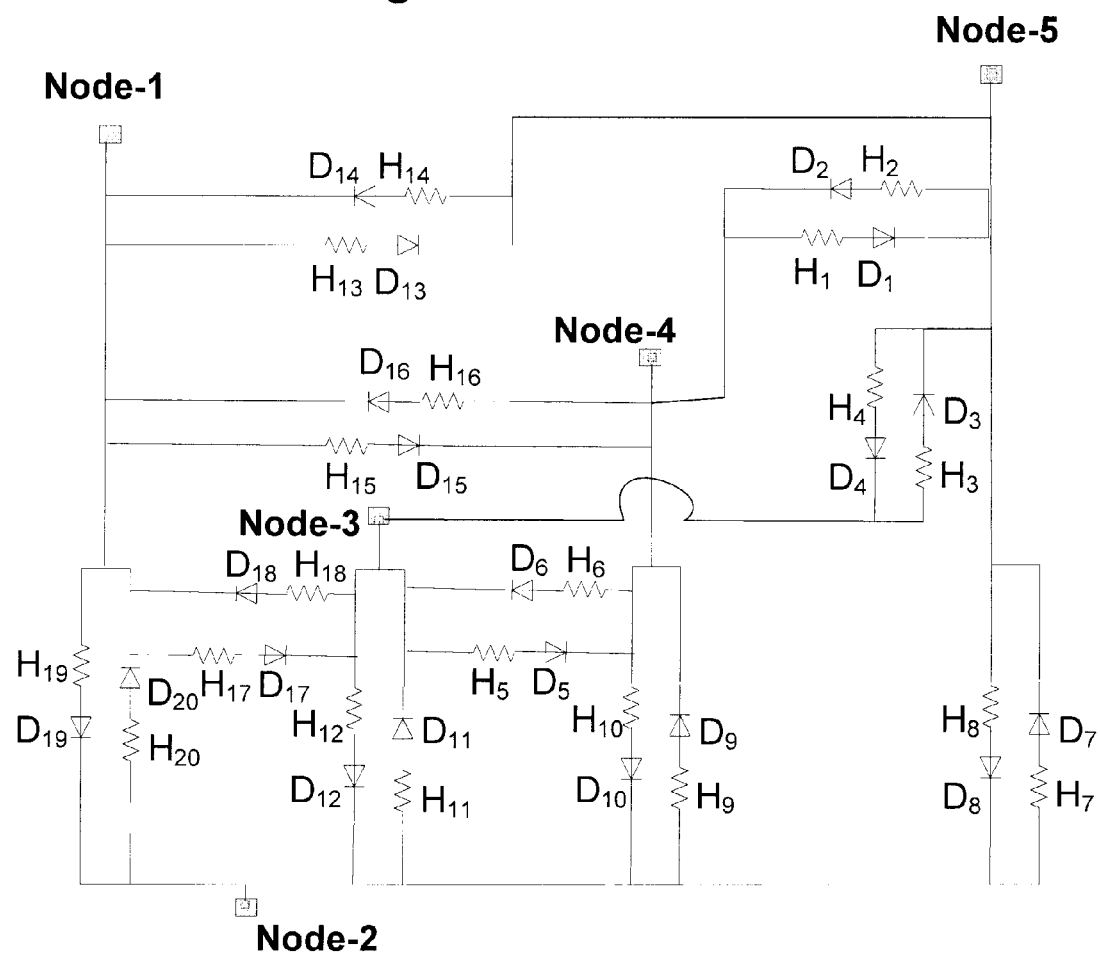
FIG. 3d illustrates a 5-node (N=5) array, including 5*(5−1)=20 unidirectional heater-and-diode connections, in accordance with one embodiment.

Another example: In FIG. 3d, Table 3a (N=5), when Heater-1 is addressed, the current-path between Node-4 and Node-5 has length "1", while all other current paths from Node-4 to Node-5 have length "2" or greater.

the direct path from Node-4 to Node-5 has length "1",
the path from Node-4 to Node-1 to Node-5 has length "2",
the path from Node-4 to Node-2 to Node-5 has length "2",
the path from Node-4 to Node-3 to Node-5 has length "2",
the path from Node-4 to Node-1 to Node-2 to Node-5 has length "3",
the path from Node-4 to Node-2 to Node-1 to Node-5 has length "3",
the path from Node-4 to Node-1 to Node-3 to Node-5 has length "3",
the path from Node-4 to Node-3 to Node-1 to Node-5 has length "3",
the path from Node-4 to Node-2 to Node-3 to Node-5 has length "3",
the path from Node-4 to Node-3 to Node-2 to Node-5 has length "3",
the path from Node-4 to Node-1 to Node-2 to Node-3 to Node-5 has length "4",
the path from Node-4 to Node-1 to Node-3 to Node-2 to Node-5 has length "4",
the path from Node-4 to Node-2 to Node-1 to Node-3 to Node-5 has length "4",
the path from Node-4 to Node-2 to Node-3 to Node-1 to Node-5 has length "4",
the path from Node-4 to Node-3 to Node-1 to Node-2 to Node-5 has length "4",
the path from Node-4 to Node-3 to Node-2 to Node-1 to Node-5 has length "4".

In a fuse-addressing network having N nodes, where N>5, when one specific heater is being addressed, there are:
one current-path having length L="1",
(N−2) current-paths having length L="2",
(N−2)!/(N−2−(L−1))=(N−2)!/(N−2−2)!=(N−2)*(N−3) current-paths having length L="3",
(N−2)!/(N−2−(L−1))=(N−2)!/(N−2−3)!=(N−2)*(N−3)*(N−4) current-paths with length L="4",
(N−2)!/(N−2−(L−1))=(N−2)!/(N−2−4)! current-paths with length L="5",
... and so on, for all path lengths L up to L=N−1, where N>5.

In general, the fuse-blowing voltages may be digital voltage levels (corresponding to digital "High" and 0V) or analog voltages. The heater resistances $R_H$ are co-designed with the fuse-blowing voltages, such that the applied voltage difference $\Delta V$=[("High" voltage)−("Low" voltage)], applied across the unidirectional heater-and-diode connection, delivers a power-level to the heater, which delivers a power-level to the fuse, which is in turn appropriate for blowing the fuse.

The relationship between $\Delta V$ and $V_H$ is affected by the presence of the diode (s): $\Delta V$=[$V_H$+(M×$V_{diode}$)], where $V_{diode}$ is the voltage drop across a forward-biased diode (typically ~0.6V), and M is the number of same-directed diodes in the unidirectional heater-and-diode connection. In FIG. 2a, M=1 and in FIG. 2b, M=2.

The heater resistances $R_H$ can be co-designed with the fuse-blowing voltages, such that the applied voltage difference $\Delta V$=[("High" voltage)−("Low" voltage)] delivers a power to the heater, [$V_H^2/R_H$], which is appropriate for blowing the fuse. Note that this power required to blow the fuse itself does not include the power dissipated in the series-connected diode (M=1) or diodes (M>1), and does not include the power dissipated in any additional resistance(s) which may be connected in series or parallel with the heater-and-diode.

For a given heater-resistance, $R_H$, and a given set of M diode(s), this normal fuse-blowing power $P_H^*$ corresponds to a "normal fuse-blowing voltage-difference", $\Delta V^*$. Since there may be some uncertainty in the knowledge of the resistance $R_H$, an additional voltage-difference is added to further ensure that the actual power delivered remains above $P_{H-th-upper}$. In general, the "normal fuse-blowing voltage-difference" $\Delta V^*$, should be sufficiently high such that $P_H^*$ be sufficiently above $P_{H-th-upper}$, to ensure that the fuse be fully and permanently blown, even if the heater resistance varies slightly away from $R_H$.

In order to be able to address each heater independently for fuse-blowing, the heaters, fuses, and fuse-blowing voltage and power levels, are co-designed such that the power dissipated in any other (non-addressed) heater remains sufficiently below $P_{H-th-lower}$, the dissipated-power threshold for irreversible change in the heater itself or the associated fuse. In order to maintain independent random-access addressability of heaters and fuse-blowing, this condition is held regardless of the network's prior fuse-blowing state, i.e. if one or more of the fuses was previously blown, this will not prevent or compromise addressing and blowing of any other heater/fuse in the array. If the network of heaters changes its state due to prior addressing and/or fuse-blowing events, then the state of the network will not allow any non-addressed heater to receive more power than $P_{H-th-lower}$, when an addressed heater receives normal fuse-blowing power $P_H^*$. For use in the analysis below, let us represent this condition as $P_{H-th-lower} > P_{H-non-addressed-max}$. In order to implement this, previously addressed heaters do not have significantly reduced resistances vs. their initial states in a new network.

Consider the case where all heaters have the same resistance value, $R_H$. Consider, for example, the case of N=4, and where Heater-1 is being addressed, according to the first line of Table 2a and FIG. 3b. Assuming that the network has been designed to deliver $P_H^*$ to Heater-1, the voltage across Heater-1 will be $V_{H1}$=($\Delta V^*$−m·diode)=($V_3$−$V_4$−M·$V_{diode}$) where $V_{diode}$ is the voltage drop across the forward-biased diode(s), and the power dissipated in Heater-1 will be $P_H^* = P_{H1} = V_{H1}^2/R_H$. Let us call this $V_{H-addressed}$.

When Heater-1 is thus addressed, given that all other heaters are in their initial states having resistances=$R_H$, the voltages across other heater-and-diode connections will be reduced by a factor greater than or equal to 2, i.e. will be divided by a number≥2. The voltages and power dissipation levels in each heater can be found using basic electric circuit analysis. For a non-addressed heater where the network is still in its initial state, the voltage $\Delta V^*$ will be applied across two heater-and-diode connections in series, and $V_{H-non-addressed}$ will be ($\Delta V^*$−2·M·$V_{diode}$)/2. This $V_{H-non-addressed}$ will be less than half of $V_{H-addressed}$=($\Delta V^*$−M·$V_{diode}$). Table 2b shows voltages and power dissipation levels in each of the other heaters when Heater-1 is being addressed, when all other heaters are in their initial states having resistances=$R_H$.

TABLE 2b

| Heater Voltages for N = 4, when one specific Heater (Heater-1) is addressed. See FIG. 3b. | | | | | Heater-V and Heater-P, when Heater-1 is addressed, and all other heaters have initial states $R_H$: | |
|---|---|---|---|---|---|---|
| Node-1 ($V_1$) | Node-2 ($V_2$) | Node-3 ($V_3$) | Node-4 ($V_4$) | | $V_H$ | $P_H$ |
| Floating | Floating | High | Low | Heater-1 | $V_{H1} = (V_3 - V_4 - MV_{diode})$ | $P_{H1} = V_{H1}^2/R_H = P_H^*$ |
| Floating | Floating | High | Low | Heater-2 | 0 (due to $D_2$) | 0 (due to $D_2$) |
| Floating | Floating | High | Low | Heater-3 | $V_{H3} = (V_{H1}/2) - MV_{diode}$ | $P_{H3} < P_{H1}/4$ |
| Floating | Floating | High | Low | Heater-4 | 0 (due to $D_4$) | 0 (due to $D_4$) |
| Floating | Floating | High | Low | Heater-5 | 0 (due to $D_5$) | 0 (due to $D_5$) |
| Floating | Floating | High | Low | Heater-6 | $V_{H6} = (V_{H1}/2) - MV_{diode}$ | $P_{H6} < P_{H1}/4$ |
| Floating | Floating | High | Low | Heater-7 | $V_{H7} = (V_{H1}/2) - MV_{diode}$ | $P_{H7} < P_{H1}/4$ |
| Floating | Floating | High | Low | Heater-8 | 0 (due to $D_8$) | 0 (due to $D_8$) |
| Floating | Floating | High | Low | Heater-9 | 0 (due to $D_9$) | 0 (due to $D_9$) |
| Floating | Floating | High | Low | Heater-10 | $V_{H10} = (V_{H1}/2) - MV_{diode}$ | $P_{H10} < P_{H1}/4$ |
| Floating | Floating | High | Low | Heater-11 | 0 (since $V_1 \approx V_2$) | 0 (since $V_1 \approx V_2$) |
| Floating | Floating | High | Low | Heater-12 | 0 (since $V_1 \approx V_2$) | 0 (since $V_1 \approx V_2$) |

If an addressing or fuse-blowing event does not change the addressed heater's resistance, then this will also be the state of the network after any previous addressing or fuse-blowing events, all heaters having initial resistances $R_H$. In this case, the highest power in a non-addressed heater will be less than one quarter of the normal fuse-blowing power, $P_{H\text{-}non\text{-}addressed\text{-}max} < P_H^*/4$ and one can meet the condition $P_{H\text{-}th\text{-}lower} > P_{H\text{-}non\text{-}addressed\text{-}max}$ by maintaining $P_{H\text{-}th\text{-}lower} > P_H^*/4$ (in other words, by designing the microstructure, heater and fuse such that $P_{H\text{-}th\text{-}lower} > P_H^*/4$).

If, on the other hand, an addressing or fuse-blowing event open-circuits the addressed heater, then in order to maintain independent addressability of heaters and fuse-blowing, it should still true that, if one of the fuses is blown, this should not prevent or compromise addressing and blowing of any other heater/fuse in the array. In order to implement this, previously addressed heaters are not to have significantly reduced resistances, and should not change the network enough to increase the power dissipated in any non-addressed heater close to $P_H^*$. In other words, the maximum power dissipated in any non-addressed Heater, $P_{H\text{-}non\text{-}addressed\text{-}maxi}$ should remain well below $P_H^*$.

Consider the case where Heater-3 has been open-circuited by a previous fuse-blowing event. Table 2c describes the voltages and dissipated power levels present in each of the heaters when Heater-1 is being addressed. The maximum dissipated power in a non-addressed heater is in Heater-7, where $9P_H^*/25$ is dissipated, where the presence of [Heater-6+Heater-11] in parallel with Heater-10, act to raise the floating voltage at Node-1, thus increasing the voltage across Heater-7. In this case described in Table 2c, $P_{H\text{-}non\text{-}addressed\text{-}max} = 9P_H^*/25$, and $P_H^* > P_{H\text{-}th\text{-}upper} > P_{H\text{-}th\text{-}lower} > 9P_H^*/25$.

TABLE 2c

| Heater Voltages for N = 4, when one specific Heater (Heater-1) is addressed. See FIG. 3b and 3c. | | | | | Heater-V and Heater-P, when Heater-1 is addressed, and all other heaters have initial states $R_H$, except Heater-3 which is open-circuited. $V_D = V_{diode}$: | |
|---|---|---|---|---|---|---|
| Node-1 ($V_1$) | Node-2 ($V_2$) | Node-3 ($V_3$) | Node-4 ($V_4$) | | $V_H$ | $P_H$ |
| Floating | Floating | High | Low | Heater-1 | $V_{H1} = (V_3 - V_4 - MV_{diode})$ | $P_{H1} = V_{H1}^2/R_H = P_H^*$ |
| Floating | Floating | High | Low | Heater-2 | 0 (due to $D_2$) | 0 (due to $D_2$) |
| Floating | Floating | High | Low | Heater-3 | 0 (open-circuit) | 0 (open-circuit) |
| Floating | Floating | High | Low | Heater-4 | 0 (due to $D_4$) | 0 (due to $D_4$) |
| Floating | Floating | High | Low | Heater-5 | 0 (due to $D_5$) | 0 (due to $D_5$) |
| Floating | Floating | High | Low | Heater-6 | $V_{H6} < V_{H1}/5$ | $P_{H6} < P_{H1}/25$ |
| Floating | Floating | High | Low | Heater-7 | $V_{H7} = 3V_{H1}/5 - 2MV_D/5$ | $P_{H7} < 9P_{H1}/25$ |
| Floating | Floating | High | Low | Heater-8 | 0 (due to $D_8$) | 0 (due to $D_8$) |
| Floating | Floating | High | Low | Heater-9 | 0 (due to $D_9$) | 0 (due to $D_9$) |

TABLE 2c-continued

| Heater Voltages for N = 4, when one specific Heater (Heater-1) is addressed. See FIG. 3b and 3c. | | | | Heater-V and Heater-P, when Heater-1 is addressed, and all other heaters have initial states $R_H$, except Heater-3 which is open-circuited. $V_D = V_{diode}$. | |
|---|---|---|---|---|---|
| Node-1 ($V_1$) | Node-2 ($V_2$) | Node-3 ($V_3$) | Node-4 ($V_4$) | $V_H$ | $P_H$ |
| Floating | Floating | High | Low | Heater-10 | $V_{H10} < 2V_{H1}/5$ | $P_{H10} < 4P_{H1}/25$ |
| Floating | Floating | High | Low | Heater-11 | $V_{H11} < V_{H1}/5$ | $P_{H11} < P_{H1}/25$ |
| Floating | Floating | High | Low | Heater-12 | 0 (due to $D_{12}$) | 0 (due to $D_{12}$) |

In general, if the combination of normal fuse-blowing voltage $P_H^*$, $P_{H\text{-}th\text{-}upper}$, $P_{H\text{-}th\text{-}lower}$, $P_{H\text{-}non\text{-}addressed\text{-}max}$, are designed such that $P_H^* > P_{H\text{-}th\text{-}upper} > P_{H\text{-}th\text{-}lower} > P_{H\text{-}non\text{-}addressed\text{-}max}$, then the array of fuse-blowing heaters will offer independent addressing of any heater.

By analysis of the N=4 network, for the case where addressing a fuse open-circuits the associated heater, this value, $(P_{H\text{-}non\text{-}addressed\text{-}max}) = 9P_{H1}/25$ is greater than the maximum for any combination of already-blown Heaters. Other combinations are shown in Table 2d and Table 2e.

TABLE 2d

| Heater Voltages for N = 4, when one specific Heater (Heater-1) is addressed. See FIG. 3b. | | | | Heater-V and Heater-P, when Heater-1 is addressed, and all other heaters have initial states $R_H$, except Heater-3 and Heater-10, which are both open-circuited. | | |
|---|---|---|---|---|---|---|
| Node-1 ($V_1$) | Node-2 ($V_2$) | Node-3 ($V_3$) | Node-4 ($V_4$) | | $V_H$ | $P_H$ |
| Floating | Floating | High | Low | Heater-1 | $V_{H1} = (V_3-V_4 - MV_{diode})$ | $P_{H1} = V_{H1}^2/R_H = P_H^*$ |
| Floating | Floating | High | Low | Heater-2 | 0 (due to $D_2$) | 0 (due to $D_2$) |
| Floating | Floating | High | Low | Heater-3 | 0 (open-circuit) | 0 (open-circuit) |
| Floating | Floating | High | Low | Heater-4 | 0 (due to $D_4$) | 0 (due to $D_4$) |
| Floating | Floating | High | Low | Heater-5 | 0 (due to $D_5$) | 0 (due to $D_5$) |
| Floating | Floating | High | Low | Heater-6 | $V_{H6} < V_{H1}/3$ | $P_{H6} < P_{H1}/9$ |
| Floating | Floating | High | Low | Heater-7 | $V_{H7} = V_{H1}/3$ | $P_{H7} < P_{H1}/9$ |
| Floating | Floating | High | Low | Heater-8 | 0 (due to $D_8$) | 0 (due to $D_8$) |
| Floating | Floating | High | Low | Heater-9 | 0 (due to $D_9$) | 0 (due to $D_9$) |
| Floating | Floating | High | Low | Heater-10 | 0 (open-circuit) | 0 (open-circuit) |
| Floating | Floating | High | Low | Heater-11 | $V_{H11} < V_{H1}/3$ | $P_{H11} < P_{H1}/9$ |
| Floating | Floating | High | Low | Heater-12 | 0 (due to $D_{12}$) | 0 (due to $D_{12}$) |

TABLE 2e

| Heater Voltages for N = 4, when one specific Heater (Heater-1) is addressed. See FIG. 3b. | | | | Heater-V and Heater-P, when Heater-1 is addressed, and all other heaters have initial states $R_H$, except Heater-3 and Heater-7, which are both open-circuited. | | |
|---|---|---|---|---|---|---|
| Node-1 ($V_1$) | Node-2 ($V_2$) | Node-3 ($V_3$) | Node-4 ($V_4$) | | $V_H$ | $P_H$ |
| Floating | Floating | High | Low | Heater-1 | $V_{H1} = (V_3-V_4 - MV_{diode})$ | $P_{H1} = V_{H1}^2/R_H = P_H^*$ |

TABLE 2e-continued

| Heater Voltages for N = 4, when one specific Heater (Heater-1) is addressed. See FIG. 3b. | | | | Heater-V and Heater-P, when Heater-1 is addressed, and all other heaters have initial states $R_H$, except Heater-3 and Heater-7, which are both open-circuited. | | |
|---|---|---|---|---|---|---|
| Node-1 $(V_1)$ | Node-2 $(V_2)$ | Node-3 $(V_3)$ | Node-4 $(V_4)$ | | $V_H$ | $P_H$ |
| Floating | Floating | High | Low | Heater-2 | 0 (due to $D_2$) | 0 (due to $D_2$) |
| Floating | Floating | High | Low | Heater-3 | 0 (open-circuit) | 0 (open-circuit) |
| Floating | Floating | High | Low | Heater-4 | 0 (due to $D_4$) | 0 (due to $D_4$) |
| Floating | Floating | High | Low | Heater-5 | 0 (due to $D_5$) | 0 (due to $D_5$) |
| Floating | Floating | High | Low | Heater-6 | 0 ($V_1 \approx V_2 \approx V_3$) | 0 ($V_1 \approx V_2 \approx V_3$) |
| Floating | Floating | High | Low | Heater-7 | 0 (open-circuit) | 0 (open-circuit) |
| Floating | Floating | High | Low | Heater-8 | 0 (due to $D_8$) | 0 (due to $D_8$) |
| Floating | Floating | High | Low | Heater-9 | 0 (due to $D_9$) | 0 (due to $D_9$) |
| Floating | Floating | High | Low | Heater-10 | 0 ($V_1 \approx V_2 \approx V_3$) | 0 ($V_1 \approx V_2 \approx V_3$) |
| Floating | Floating | High | Low | Heater-11 | 0 (since $V_1 \approx V_2$) | 0 (since $V_1 \approx V_2$) |
| Floating | Floating | High | Low | Heater-12 | 0 (since $V_1 \approx V_2$) | 0 (since $V_1 \approx V_2$) |

Figure 1A:
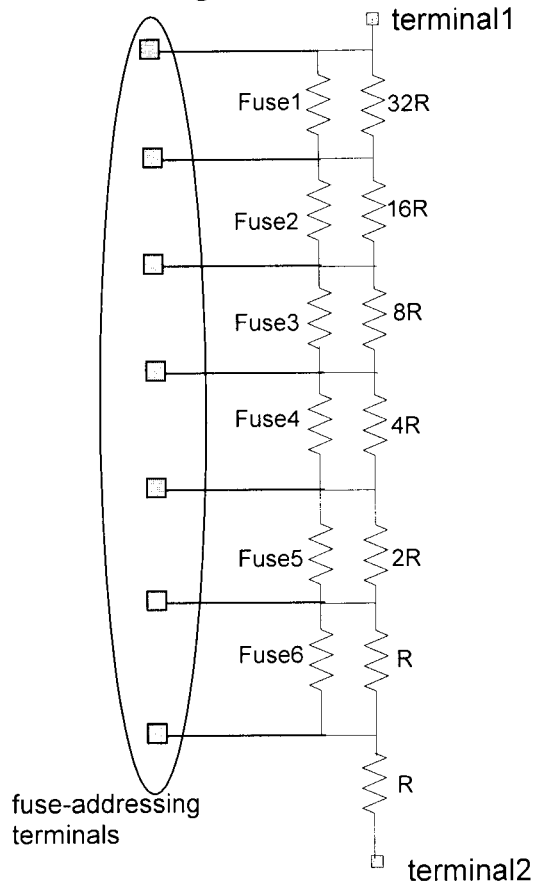
FIG. 1a illustrates an example of a fuse-adjustable resistance, having 6 bits of precision, from R to 64 R, in accordance with the prior art.
Figure 1B:
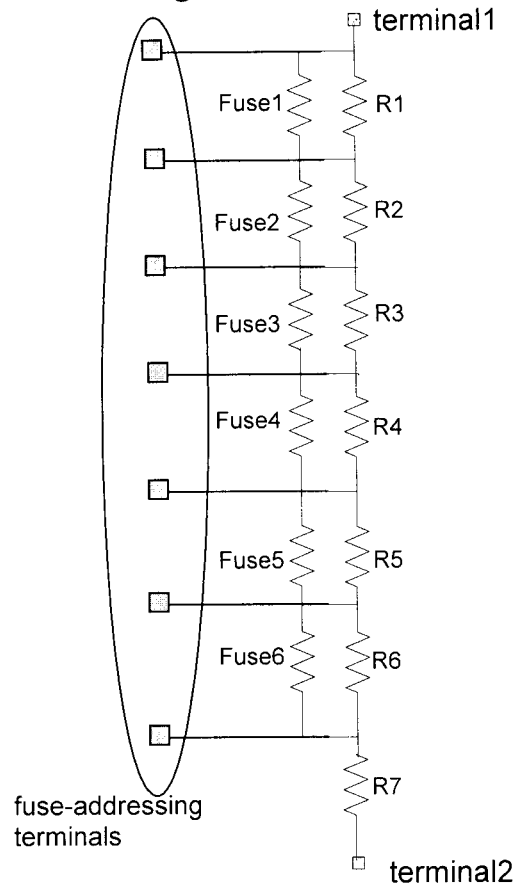
FIG. 1b illustrates an example of a series-connected fuse-adjustable resistance, having 6 fuses in order to independently include 6 different resistances R1-R6, in accordance with the prior art.
Figure 1C:
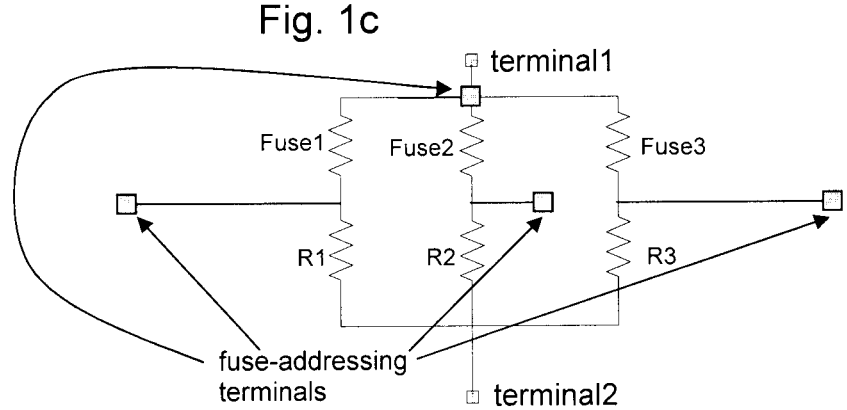
FIG. 1c illustrates an example of a parallel-connected fuse-adjustable resistance, having 3 fuses to independently disconnect 3 different resistances R1-R3, in accordance with the prior art.

Consider the application of the heater-and-diode network in an adjustable resistance of the type shown in FIG. 1. If N=4, up to 12 heaters are available for fuse-blowing, offering the potential for 12-bit precision, which is better than 0.05% adjustment precision, with the ability to achieve any resistance value from 0% to 100% of the total resistance value.

If N=5, up to 5*(5−1)=20 heaters are available for fuse-blowing, offering the potential for 20 bits of precision. Table 3a shows the heater-addressing node-voltages for the case of N=5, in accordance with one embodiment.

TABLE 3a

| Heater-Addressing Voltages for N = 5. See FIG. 3d. | | | | | |
|---|---|---|---|---|---|
| | Node-1 $(V_1)$ | Node-2 $(V_2)$ | Node-3 $(V_3)$ | Node-4 $(V_4)$ | Node-5 $(V_5)$ |
| Heater-1 | Floating | Floating | Floating | High | Low |
| Heater-2 | Floating | Floating | Floating | Low | High |
| Heater-3 | Floating | Floating | High | Floating | Low |
| Heater-4 | Floating | Floating | Low | Floating | High |
| Heater-5 | Floating | Floating | High | Low | Floating |
| Heater-6 | Floating | Floating | Low | High | Floating |
| Heater-7 | Floating | High | Floating | Floating | Low |
| Heater-8 | Floating | Low | Floating | Floating | High |
| Heater-9 | Floating | High | Floating | Low | Floating |
| Heater-10 | Floating | Low | Floating | High | Floating |
| Heater-11 | Floating | High | Low | Floating | Floating |
| Heater-12 | Floating | Low | High | Floating | Floating |
| Heater-13 | High | Floating | Floating | Floating | Low |
| Heater-14 | Low | Floating | Floating | Floating | High |
| Heater-15 | High | Floating | Floating | Low | Floating |
| Heater-16 | Low | Floating | Floating | High | Floating |
| Heater-17 | High | Floating | Low | Floating | Floating |
| Heater-18 | Low | Floating | High | Floating | Floating |
| Heater-19 | High | Low | Floating | Floating | Floating |
| Heater-20 | Low | High | Floating | Floating | Floating |

Table 3b shows, for the case of N=5, the voltages and power dissipation levels in each of the other heaters when Heater-1 is being addressed, when all other heaters are in their initial states having resistances=$R_H$.

TABLE 3b

| Heater Voltages for N = 5, when one specific Heater is addressed. See FIG. 3d. | | | | | | Heater-V and Heater-P, when Heater-1 is addressed, and all other heaters have initial states $R_H$: | |
|---|---|---|---|---|---|---|---|
| Node-1 ($V_1$) | Node-2 ($V_2$) | Node-3 ($V_3$) | Node-4 ($V_4$) | Node-5 ($V_5$) | | $V_H$ | $P_H$ |
| Floating | Floating | Floating | High | Low | Heater-1 | $V_{H1} = (V_4 - V_5 - MV_{diode})$ | $P_{H1} = V_{H1}^2/R_H = P_H^*$ |
| Floating | Floating | Floating | High | Low | Heater-2 | $0\ (D_2)$ | $0\ (D_2)$ |
| Floating | Floating | Floating | High | Low | Heater-3 | $V_{H3} < V_{H1}/2$ | $P_{H3} < P_{H1}/4$ |
| Floating | Floating | Floating | High | Low | Heater-4 | $0\ (D_4)$ | $0\ (D_4)$ |
| Floating | Floating | Floating | High | Low | Heater-5 | $0\ (D_5)$ | $0\ (D_5)$ |
| Floating | Floating | Floating | High | Low | Heater-6 | $V_{H6} < V_{H1}/2$ | $P_{H6} < P_{H1}/4$ |
| Floating | Floating | Floating | High | Low | Heater-7 | $V_{H7} < V_{H1}/2$ | $P_{H7} < P_{H1}/4$ |
| Floating | Floating | Floating | High | Low | Heater-8 | $0\ (D_8)$ | $0\ (D_8)$ |
| Floating | Floating | Floating | High | Low | Heater-9 | $0\ (D_9)$ | $0\ (D_9)$ |
| Floating | Floating | Floating | High | Low | Heater-10 | $V_{H10} < V_{H1}/2$ | $P_{H10} < P_{H1}/4$ |
| Floating | Floating | Floating | High | Low | Heater-11 | $0\ (V_1 \approx V_2 \approx V_3)$ | $0\ (V_1 \approx V_2 \approx V_3)$ |
| Floating | Floating | Floating | High | Low | Heater-12 | $0\ (V_1 \approx V_2 \approx V_3)$ | $0\ (V_1 \approx V_2 \approx V_3)$ |
| Floating | Floating | Floating | High | Low | Heater-13 | $V_{H13} < V_{H1}/2$ | $P_{H13} < P_{H1}/4$ |
| Floating | Floating | Floating | High | Low | Heater-14 | $0\ (D_{14})$ | $0\ (D_{14})$ |
| Floating | Floating | Floating | High | Low | Heater-15 | $0\ (D_{15})$ | $0\ (D_{15})$ |
| Floating | Floating | Floating | High | Low | Heater-16 | $V_{H16} < V_{H1}/2$ | $P_{H16} < P_{H1}/4$ |
| Floating | Floating | Floating | High | Low | Heater-17 | $0\ (V_1 \approx V_2 \approx V_3)$ | $0\ (V_1 \approx V_2 \approx V_3)$ |
| Floating | Floating | Floating | High | Low | Heater-18 | $0\ (V_1 \approx V_2 \approx V_3)$ | $0\ (V_1 \approx V_2 \approx V_3)$ |
| Floating | Floating | Floating | High | Low | Heater-19 | $0\ (V_1 \approx V_2 \approx V_3)$ | $0\ (V_1 \approx V_2 \approx V_3)$ |
| Floating | Floating | Floating | High | Low | Heater-20 | $0\ (V_1 \approx V_2 \approx V_3)$ | $0\ (V_1 \approx V_2 \approx V_3)$ |

Again, if an addressing or fuse-blowing event does not change the addressed heater's resistance, then this will also be the state of the network after any previous addressing or fuse-blowing events, all heaters having initial resistances $R_H$. In this case, the highest power in a non-addressed heater will again be less than one quarter of the normal fuse-blowing power, $P_{H\text{-}non\text{-}addressed\text{-}max} = P_H^*/4$, and one can meet the condition $P_{H\text{-}th\text{-}lower} > P_{H\text{-}non\text{-}addressed\text{-}max}$ by maintaining $P_{H\text{-}th\text{-}lower} > P_H^*/4$.

If addressing a heater open-circuits the heater, then for N=5, the worst case of previously-addressed heaters is, for example, when addressing Heater-1, after Heater-3 and Heater-7 have been previously addressed. Table 3c shows this case.

TABLE 3c

| Heater Voltages for N = 5, when one specific Heater is addressed. See FIG. 3d. | | | | | | Heater-V and Heater-P, when Heater-1 is addressed, and all other heaters have initial states $R_H$, except Heater-3 and Heater-7, which are both open-circuited. | |
|---|---|---|---|---|---|---|---|
| Node-1 ($V_1$) | Node-2 ($V_2$) | Node-3 ($V_3$) | Node-4 ($V_4$) | Node-5 ($V_5$) | | $V_H$ | $P_H$ |
| Floating | Floating | Floating | High | Low | Heater-1 | $V_{H1} = (V_4 - V_5 - MV_{diode})$ | $P_{H1} = V_{H1}^2/R_H = P_H^*$ |
| Floating | Floating | Floating | High | Low | Heater-2 | $0\ (D_2)$ | $0\ (D_2)$ |
| Floating | Floating | Floating | High | Low | Heater-3 | $0\ (\text{open-ckt})$ | $0\ (\text{open-ckt})$ |
| Floating | Floating | Floating | High | Low | Heater-4 | $0\ (D_4)$ | $0\ (D_4)$ |
| Floating | Floating | Floating | High | Low | Heater-5 | $0\ (D_5)$ | $0\ (D_5)$ |
| Floating | Floating | Floating | High | Low | Heater-6 | $V_{H6} < V_{H1}/6$ | $P_{H6} < P_{H1}/36$ |

TABLE 3c-continued

| | Heater Voltages for N = 5, when one specific Heater is addressed. See FIG. 3d. | | | | | Heater-V and Heater-P, when Heater-1 is addressed, and all other heaters have initial states $R_H$, except Heater-3 and Heater-7, which are both open-circuited. | |
|---|---|---|---|---|---|---|---|
| Node-1 ($V_1$) | Node-2 ($V_2$) | Node-3 ($V_3$) | Node-4 ($V_4$) | Node-5 ($V_5$) | | $V_H$ | $P_H$ |
| Floating | Floating | Floating | High | Low | Heater-7 | 0 (open-ckt) | 0 (open-ckt) |
| Floating | Floating | Floating | High | Low | Heater-8 | 0 ($D_8$) | 0 ($D_8$) |
| Floating | Floating | Floating | High | Low | Heater-9 | 0 ($D_9$) | 0 ($D_9$) |
| Floating | Floating | Floating | High | Low | Heater-10 | $V_{H10} < V_{H1}/6$ | $P_{H10} < P_{H1}/36$ |
| Floating | Floating | Floating | High | Low | Heater-11 | 0 ($V_2 \approx V_3$) | 0 ($V_2 \approx V_3$) |
| Floating | Floating | Floating | High | Low | Heater-12 | 0 ($V_2 \approx V_3$) | 0 ($V_2 \approx V_3$) |
| Floating | Floating | Floating | High | Low | Heater-13 | $V_{H13} < 2V_{H1}/3$ | $P_{H13} < 4P_{H1}/9$ |
| Floating | Floating | Floating | High | Low | Heater-14 | 0 ($D_{14}$) | 0 ($D_{14}$) |
| Floating | Floating | Floating | High | Low | Heater-15 | 0 ($D_{15}$) | 0 ($D_{15}$) |
| Floating | Floating | Floating | High | Low | Heater-16 | $V_{H16} < V_{H1}/3$ | $P_{H16} < P_{H1}/9$ |
| Floating | Floating | Floating | High | Low | Heater-17 | 0 ($D_{17}$) | 0 ($D_{17}$) |
| Floating | Floating | Floating | High | Low | Heater-18 | $V_{H18} < V_{H1}/6$ | $P_{H18} < P_{H1}/36$ |
| Floating | Floating | Floating | High | Low | Heater-19 | 0 ($D_{19}$) | 0 ($D_{19}$) |
| Floating | Floating | Floating | High | Low | Heater-20 | $V_{H20} < V_{H1}/6$ | $P_{H20} < P_{H1}/36$ |

By analysis of the N=5 network, this value, $P_{H\text{-non-addressed-max}} = 4P_{H1}/9$ is greater than the maximum for any other combination of already-blown heaters.

In general, one way to achieve independent addressing of any fuse-blowing heater in a network is to meet the following constraint: $P_H^* > P_{H\text{-th-upper}} > P_{H\text{-th-lower}} > P_{H\text{-non-addressed-max}}$. This can be done using material and geometry relationships or by designing the network with certain parameters.

The diodes in series with each heater-resistor have the effect of reducing the power applied to any non-addressed heater. They also reduce the power applied to the addressed heater, but proportionally the power in the non-addressed heater is reduced by more. In general, the ratio of $P_{H\text{-non-addressed-max}}$ to $P_{H\text{-addressed}}$ can be reduced by increasing the number of diodes, M, in series with each heater. This may come at the expense of silicon area for the additional diodes. This ratio can also be reduced by reducing the resistance of the heaters in order to lower the potential drop across the heaters as compared to the potential drop across the diode or diodes. Note also this ratio can be reduced by increasing the potential drop across the diodes, if such diodes are available.

In general, additional diodes in series with the heater-resistors cause the most significant improvement in ratio $P_{H\text{-non-addressed-max}}$ vs. $P_{H\text{-addressed}}$ when the heater-resistance is low. However, often reduction of resistance is correlated with increase in thermal conduction, (e.g. by wider resistive trace), which may decrease the thermal isolation of the thermally-isolated microstructure. This tradeoff should be addressed in the design phase of the addressing network and fuses.

The embodiments of the invention described above are intended to be exemplary only. The scope of the invention is therefore intended to be limited solely by the scope of the appended claims.

We claim:

1. A resistive-heater addressing network comprising:
    at least two pairs of heater-diode connections, each pair of heater-diode connections comprising:
        a first unidirectional heater-diode connection comprising a first resistive-heater and at least one first diode connected together in series, said at least one first diode directed in a first forward-biased direction;
        a second unidirectional heater-diode connection comprising a second resistive-heater and at least one second diode connected together in series, said at least one second diode directed in a second forward-biased direction opposite from the first forward-biased direction;
    N nodes, where N is an integer >2, each one of the N nodes being connected to at least another one of the N nodes by one of the pairs of heater-diode connections, each resistive-heater of the network being individually addressable by applying a voltage difference across a pair of nodes.

2. The network of claim 1, wherein N*(N−1) unidirectional heater-diode connections are in the network, and wherein each node has N−1 pairs of heater-diode connections connected thereto.

3. The network of claim 1, wherein all of the unidirectional heater-diode connections are connected to a common node.

4. The network of claim 1, wherein all of the heater-diode connections comprise a same number of diodes per heater-diode connection.

5. The network of claim 1, wherein all of the resistive-heaters in the network have a substantially same resistance value.

6. The network of claim 1, wherein at least one of the resistive-heaters in the network is made of a substantially non-trimming material.

7. The network of claim 1, wherein at least one of the resistive-heaters in the network is thermally-isolated.

8. The network of claim 7, wherein thermal isolation is provided by a thermally-isolated microstructure on which the at least one of the resistive-heaters resides.

9. The network of claim 1, wherein the network is electrically equivalent from all of the N nodes when in its initial state.

10. The network of claim 7, wherein thermal isolation of all resistive-heaters is substantially the same.

11. The network of claim 1, wherein any current path other than a current path through a pair of heater-diode connections between a selected pair of nodes comprises at least two pairs of heater-diode connections.

12. The network of claim 1, wherein any current path other than a current path directly through an addressed resistive-heater dissipates less than half of the power which is dissipated in the addressed resistive-heater.

13. The network of claim 1, wherein any current path other than a current path directly through an addressed resistive-heater dissipates less than half of the power which is dissipated in the addressed resistive-heater, even after previous addressing events in the network.

14. A circuit comprising:
a resistive-heater addressing network comprising N nodes, where N is an integer >1, at least one of the N nodes connected to at least another one of the N nodes by a pair of heater-diode connections, each pair of heater-diode connections comprising:
a first unidirectional heater-diode connection comprising a first resistive-heater and at least one first diode connected together in series, said at least one first diode directed in a first forward-biased direction; and
a second unidirectional heater-diode connection comprising a second resistive-heater and at least one second diode connected together in series, said at least one second diode directed in a second forward-biased direction opposite to said first forward-biased direction; and
an application circuit electrically isolated from the resistive-heater addressing network comprising at least two fuses each thermally-coupled to one of said first and second resistive-heater.

15. The circuit of claim 14, wherein the application circuit comprises at least one of resistors, inductors and capacitors as passive devices.

16. The circuit of claim 14, wherein the application circuit comprises only passive elements.

17. The circuit of claim 14, wherein at least one fuse of the at least two fuses is electrically connected to at least one active element in the application circuit.

18. The circuit of claim 14, wherein at least one resistive-heater and at least one fuse are thermally-coupled to each other and thermally-isolated from surrounding components.

19. The circuit of claim 14, wherein at least one of the fuses in the application circuit is positioned to cause a modification to an interconnect line of the application circuit upon becoming open-circuit.

20. The circuit of claim 14, wherein at least one of the fuses in the application circuit is positioned to cause a modification to at least one of a resistance value, an inductance value, and a capacitance value of a portion of the application circuit by blowing the fuse.

21. A method for selectively addressing specific resistive-heaters from a resistive-heater addressing network, the method comprising:
selecting a pair of nodes from the resistive-heater addressing network having N nodes, where N is an integer >1, at least one of the N nodes connected to at least another one of the N nodes by a pair of heater-diode connections, each pair of heater-diode connections comprising:
a first unidirectional heater-diode connection comprising a first resistive-heater and at least one first diode connected together in series, said at least one first diode directed in a first forward-biased direction; and
a second unidirectional heater-diode connection comprising a second resistive-heater and at least one second diode connected together in series, said at least one second diode directed in a second forward-biased direction opposite to said first forward-biased direction; and
applying a potential difference across a selected pair of nodes to cause a current to flow in one of the first unidirectional heater-diode connection and the second unidirectional heater-diode connection in accordance with a polarity of the potential difference, thereby addressing a corresponding resistive-heater, while leaving N-2 remaining nodes in said network electrically floating.

22. The method of claim 21, wherein said applying a potential comprises dissipating power in one of the first resistive-heater and the second resistive-heater by passing an electric current therethrough, and transferring heat generated from the dissipated power to a corresponding fuse in an application circuit to blow the fuse.

23. The method of claim 21, wherein said transferring heat generated from the dissipated power to a corresponding fuse comprises modifying an interconnection in the application circuit by causing the fuse to become open-circuited.

24. The method of claim 21, wherein said transferring heat generated from the dissipated power to a corresponding fuse comprises modifying at least one of a resistance value, an inductance value, and a capacitance value of a portion of the application circuit by blowing the fuse.

25. The method of claim 21, wherein said applying a potential comprises applying the potential for a pre-determined amount of time.

26. The method of claim 21, wherein said applying a potential comprises open-circuiting a resistive-heater across the selected pair of nodes.

27. The method of claim 21, wherein said applying a potential comprises maintaining heating capability of a resistive-heater across the selected pair of nodes for a future addressing event.

* * * * *